(12) United States Patent
Nakamura et al.

(10) Patent No.: US 11,422,043 B2
(45) Date of Patent: *Aug. 23, 2022

(54) PRESSURE SENSOR

(71) Applicant: PANASONIC INTELLECTUAL PROPERTY MANAGEMENT CO., LTD., Osaka (JP)

(72) Inventors: Yoshitaka Nakamura, Osaka (JP); Tsutomu Furuta, Hyogo (JP); Hiroyoshi Yoden, Osaka (JP); Mitsuo Yaguchi, Osaka (JP); Takeshi Ueda, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 713 days.

This patent is subject to a terminal disclaimer.

(21) Appl. No.: 16/345,174

(22) PCT Filed: Oct. 18, 2017

(86) PCT No.: PCT/JP2017/037651
§ 371 (c)(1),
(2) Date: Apr. 25, 2019

(87) PCT Pub. No.: WO2018/079363
PCT Pub. Date: May 3, 2018

(65) Prior Publication Data
US 2019/0285489 A1 Sep. 19, 2019

(30) Foreign Application Priority Data

Oct. 25, 2016 (JP) .............................. JP2016-208521
Apr. 12, 2017 (JP) .............................. JP2017-078902

(51) Int. Cl.
*G01L 1/00* (2006.01)
*G01L 1/20* (2006.01)
(Continued)

(52) U.S. Cl.
CPC .................. *G01L 1/20* (2013.01); *B32B 9/00* (2013.01); *B32B 9/045* (2013.01); *C01G 23/04* (2013.01);
(Continued)

(58) Field of Classification Search
CPC ..... G01L 1/20; G01L 1/24; G01L 9/02; G01L 9/025; G01L 11/02; G01L 11/025;
(Continued)

(56) References Cited

U.S. PATENT DOCUMENTS 4,775,549 A * 10/1988 Ota ........................ C23C 14/56
345/87
11,191,968 B1 * 12/2021 Giuffrida ........... A61N 1/37247
(Continued)

FOREIGN PATENT DOCUMENTS

CN 101458134 A 6/2009
JP 49-024683 A 3/1974
(Continued)

OTHER PUBLICATIONS

Chinese Search Report dated Jun. 3, 2020, in Chinese Patent Application No. 201780053358.2, with English translation.
(Continued)

*Primary Examiner* — Max H Noori
(74) *Attorney, Agent, or Firm* — McDermott Will & Emery LLP

(57) ABSTRACT

A pressure sensor 1 according to the first aspect of the invention includes: a substrate 50; and a functional element 40 which is laid on the substrate 50 and is composed of functional titanium oxide including crystal grains of at least
(Continued)

one of β-phase trititanium pentoxide (β-Ti$_3$O$_5$) and λ-phase trititanium pentoxide (λ-Ti$_3$O$_5$) and having the property that at least a portion of crystal grains of at least one of β-phase trititanium pentoxide (β-Ti$_3$O$_5$) and λ-phase trititanium pentoxide (λ-Ti$_3$O$_5$) change into crystal grains of titanium dioxide (TiO$_2$) when the functional titanium oxide is heated to 350° C. or higher. The substrate 50 includes a substrate thin-film section 51 having a thin film form in which the thickness in the stacking direction of the substrate 50 and the functional element 40 is smaller than that in the other directions.

16 Claims, 14 Drawing Sheets

(51) Int. Cl.

| | | |
|---|---|---|
| *B32B 9/04* | (2006.01) | |
| *C01G 23/047* | (2006.01) | |
| *G01K 11/00* | (2006.01) | |
| *G01L 1/24* | (2006.01) | |
| *G01L 9/02* | (2006.01) | |
| *G01L 11/02* | (2006.01) | |
| *G01N 25/02* | (2006.01) | |
| *H01L 29/84* | (2006.01) | |
| *C01G 23/04* | (2006.01) | |
| *B32B 9/00* | (2006.01) | |

(52) U.S. Cl.
CPC ............ *C01G 23/047* (2013.01); *G01K 11/00* (2013.01); *G01L 1/24* (2013.01); *G01L 9/02* (2013.01); *G01L 9/025* (2013.01); *G01L 11/02* (2013.01); *G01L 11/025* (2013.01); *G01N 25/02* (2013.01); *H01L 29/84* (2013.01)

(58) Field of Classification Search
CPC ...... B32B 9/045; C01G 23/04; C01G 23/047; G01K 11/00; G01N 25/02; H01L 29/84
See application file for complete search history.

(56) References Cited

U.S. PATENT DOCUMENTS

| | | | |
|---|---|---|---|
| 2002/0000593 A1* | 1/2002 | Nishiyama | H01L 21/823857 257/E21.639 |
| 2009/0146230 A1 | 6/2009 | Takizawa | |
| 2014/0312440 A1* | 10/2014 | Akiyama | G01L 9/005 257/417 |
| 2019/0185338 A1* | 6/2019 | Nakamura | C01G 23/047 |
| 2019/0244853 A1* | 8/2019 | Berger | H01L 21/76251 |

FOREIGN PATENT DOCUMENTS

| | | |
|---|---|---|
| JP | 53-114690 A | 10/1978 |
| JP | S5723362 B2 | 5/1982 |
| JP | 3013897 B2 | 2/2000 |

OTHER PUBLICATIONS

Chinese Search Report dated Jun. 12, 2020, in Chinese Patent Application No. 201780065568.3, with English translation.

Tokoro, Hiroko, et al., "External stimulation-controllable heat-storage ceramics," Nature Communications [online], 6, Article No. 7037 (2015), May 12, 2015 ,search date Nov. 7, 2017] <DOI: 10.1038/ncomms8037>.

Satoshi Takeuchi, "Present Status and Future Trend of Thermopaint", Journal of JSCM, the Japan Society of Colour Material, Japan, Jun. 20, 1978, vol. 51, No. 6, pp. 371-378; with English translation.

Kamekichi Shiba, Masahumi Ueda, Yasuo Yagi, "Thermoelectric Resistance Thermometer", Oyo Buturi, the Japan Society of Applied Physics, Japan, 1977, vol. 46, No. 10, pp. 1004-1009; with Engish abstract.

Susumu Sugiyama, "Development History of Semiconductor Pressure Sensors", Denso Technical Review, Denso Corporation, Nov. 1, 2012, vol. 17; with partial English translation.

International Search Report and Written Opinion issued in International Patent Application No. PCT/JP2017/037651, dated Jan. 23, 2018; with partial English translation.

* cited by examiner

PRESSURE SENSOR

CROSS-REFERENCE OF RELATED APPLICATIONS

This application is the U.S. National Phase under 35 U.S.C. § 371 of International Patent Application No. PCT/JP2017/037651, filed on Oct. 18, 2017, which in turn claims the benefit of Japanese Application No. 2016-208521, filed on Oct. 25, 2016, and Japanese Application No. 2017-078902, filed on Apr. 12, 2017, the entire disclosures of which Applications are incorporated by reference herein.

TECHNICAL FIELD

The invention relates to a pressure sensor that changes in physical property with a change in pressure or the like.

BACKGROUND ART

In order to measure temperatures of heat generators, functional elements have been used, such as thermopaints utilizing a change in pigment color and thermocouples utilizing the Seebeck effect. Using thermopaints, the temperature of an object is measured through a change in pigment color. Using thermocouples, the temperature of an object is measured through electrical measurement using the Seebeck effect. These techniques are disclosed in Non-patent Literatures 1 and 2, for example.

However, general thermopaints capable of measuring high temperatures are expensive. Thermocouples need to be made of noble metal, such as platinum or rhodium, depending on the range of temperature to be measured. In such a case, thermocouples are expensive. Conventional thermometers using thermopaints and conventional thermometers using thermocouples containing noble metal are thus expensive.

In this light, the inventor of the application has proposed in recent years, a temperature sensor using nanoparticles of trititanium pentoxide. Meanwhile, general trititanium pentoxide exhibits the crystalline structure of β-phase trititanium pentoxide in a low-temperature range and the crystalline structure of λ-phase trititanium pentoxide in a high-temperature range. These crystalline structures alternate with changes in temperature. In recent years, however, it has been revealed that in nanoparticles of trititanium pentoxide having a predetermined size, the crystalline structure of λ-phase trititanium pentoxide generated in a high-temperature range is maintained after cooling. The inventor of the application has found first in the world that when nanoparticles of trititanium pentoxide having a predetermined size are heated to 350° C. or higher, the crystalline form thereof changes into that of titanium dioxide ($TiO_2$), which is maintained after cooling.

β-phase trititanium pentoxide, λ-phase trititanium pentoxide, and titanium dioxide described above are different in physical properties, such as color and electric conductivity. The inventor of the application has proposed a temperature sensor including the aforementioned nanoparticles of trititanium pentoxide as the functional element which is the body of the temperature sensor. After the temperature sensor is exposed to heat, the color, electric conductivity, or the like of the functional element is measured. The temperature sensor is thereby able to measure the peak temperature at which the trititanium pentoxide can take the corresponding crystalline form. When the temperature sensor is a type using electric conductivity, the functional element is provided with two or more electrodes.

An example of the temperature sensor is illustrated in FIG. 1. A temperature sensor 100AA illustrated in FIG. 1 includes: a substrate 150A; and a functional element 40A which is laid on the substrate 150A and is made of nanoparticles of trititanium pentoxide. The functional element 40A is a pellet of nanoparticles of trititanium pentoxide, for example. The functional element 40A has a columnar shape like a functional element 40AA illustrated in FIG. 2 or a rectangular plate shape like a functional element 40AB illustrated in FIG. 3, for example.

FIG. 4 is a schematic cross-sectional view illustrating another example of the temperature sensor. A temperature sensor 100AB illustrated in FIG. 4 includes: the substrate 150A; the aforementioned functional element 40A laid on the substrate 150A; and two electrodes 70A and 70A arranged on the same surface of the functional element 40A. The electrodes 70A are made of metal, conducting oxide, conducting polymer, a carbon material, or the like, for example.

FIG. 5 illustrates still another example of the temperature sensor. A temperature sensor 100AC illustrated in FIG. 5 includes a substrate 150A; the aforementioned functional element 40A which is laid on the substrate 150A; an electrode 70A arranged on the surface of the functional element 40A; and an electrode 70A which is provided in the interface between the substrate 150A and the functional element 40A.

In recent years, the inventor of the application has found that nanoparticles of trititanium pentoxide constituting the functional element change in crystalline structure of crystal grains with a slight change in pressure. The inventor of the application is considering that the aforementioned temperature sensors 100AA, 100AB, and 100AC are also used as a pressure sensor.

However, in the temperature sensors 100AA, 100AB, and 100AC, the functional element 40A, which is made of trititanium pentoxide, and the substrate 150 normally have a great difference in thermal expansion coefficient. If these temperature sensors are used as pressure sensors in an environment where the thermal expansion tends to be large, the substrate 150A could be separated from the functional element 40A or electrodes 70A, or cracks could be produced in the functional element 40A and electrodes 70A. When aforementioned temperature sensors are used in an environment where the thermal expansion tends to be large, therefore, the substrate 150A could be separated from the functional element 40A or electrodes 70A, or cracks could be produced in the functional element 40A and electrodes 70A. This is a first problem.

Conventionally used means for measuring pressures include pressure-sensitive paper using color former-containing microcapsules, pressure sensors using a strain gauge or a piezoelectric element.

Patent Literature 1 discloses a developer sheet for pressure-sensitive recording paper that includes a developer layer on a support, for example. In the developer sheet for pressure-sensitive recording paper, pressure-sensitive paper includes a color former-containing microcapsule. Non-patent Literature 3 discloses a pressure sensor using a strain gauge or a piezoelectric element.

CITATION LIST

Patent Literature

Patent Literature 1: Japanese Patent Publication No. 3013897

Non-Patent Literature

Non-patent Literature 1: Satoshi Takeuchi, "Present Status and Future Trend of Thermopaint", Journal of JSCM, the Japan Society of Colour Material, Japan, 1978, Vol. 51, No. 6, pp 371-378

Non-patent Literature 2: Kamekichi Shiba, Masahumi Ueda, Yasuo Yagi, "Thermoelectric Resistance Thermometer", OYO BUTURI, the Japan Society of Applied Physics, Japan, 1977, Vol. 46, No. 10, pp. 1004-1009

Non-patent Literature 3: Susumu Sugiyama, "Development History of Semiconductor Pressure Sensors", Denso Technical Review, DENSO CORPORATION, 2012, Vol. 17

SUMMARY OF INVENTION

Technical Problem

However, the pressure-sensitive paper using the color former-containing microcapsules (described in Patent Literature 1) cannot be used repeatedly as a second problem. In addition, strain gauges and piezoelectric elements require power supplies for operating the elements as the second problem.

The invention was made in the light of the aforementioned first problem. An object of the invention is to provide an inexpensive pressure sensor which includes an inexpensive functional element that changes in physical property with a change in temperature and in which separation of the substrate from the functional element or electrodes or cracks in the functional element and electrodes are prevented or reduced.

The invention was also made in the light of the aforementioned second problem. Another object of the invention is to provide a pressure sensor which can be used repeatedly and does not need any power supply.

Solution to Problem

To solve the aforementioned first problem, a pressure sensor according to the first aspect of the invention includes: a substrate; and a functional element which is laid on the substrate and is composed of functional titanium oxide including crystal grains of at least one of β-phase trititanium pentoxide (β-$Ti_3O_5$) and λ-phase trititanium pentoxide (λ-$Ti_3O_5$) and having the property that at least a portion of crystal grains of at least one of β-phase trititanium pentoxide (β-$Ti_3O_5$) and λ-phase trititanium pentoxide (λ-$Ti_3O_5$) change into crystal grains of titanium dioxide ($TiO_2$) when the functional titanium oxide is heated to 350° C. or higher. The substrate includes a substrate thin-film section having a thin film form in which the thickness in the stacking direction of the substrate and the functional element is smaller than that in the other directions.

To solve the aforementioned second problem, a pressure sensor according to a second aspect of the invention includes a pressure sensor body including a functional element that has a composition of trititanium pentoxide ($Ti_3O_5$) and changes in physical property with a change in pressure when pressurized at 1 MPa or higher.

DESCRIPTION OF EMBODIMENTS

Hereinafter, a description is given of a first pressure sensor and a second pressure sensor with reference to the drawings.

<First Pressure Sensor>

Hereinafter, the first pressure sensor is described with reference to the drawings. Each pressure sensor according to first to third embodiments below is a sensor which serves as a temperature sensor in addition to as a pressure sensor and detects pressures and temperatures. In the structure of the pressure sensors according to the first and second embodiments among the pressure sensors according to the first to third embodiments, a substrate thin-film section 51 of a substrate 50A is in physical contact with a functional element 40A. The functional element 40A detects through the substrate thin-film section 51, slight pressures applied to the substrate thin-film section 51. The pressure sensors according to the first and second embodiments are able to detect slight pressures, such as ultrasonic pressures, in particular.

Pressure Sensor

First Embodiment

Figure 6:
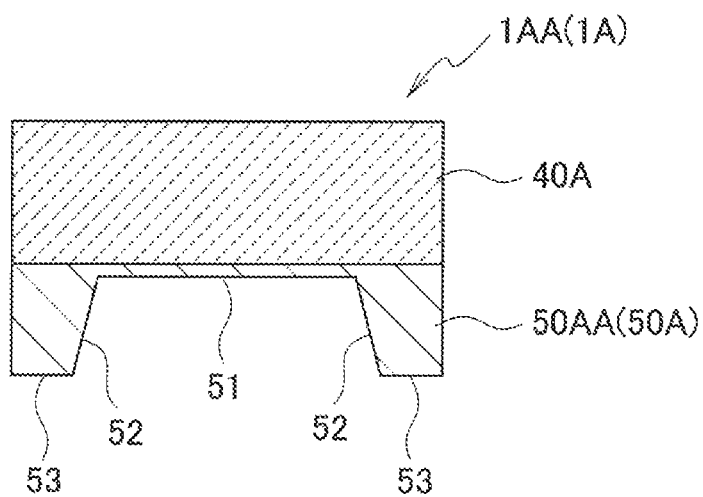
FIG. 6 is a schematic cross-sectional view illustrating a pressure sensor according to a first embodiment.

FIG. 6 is a schematic cross-sectional view illustrating the pressure sensor according to the first embodiment. A pressure sensor 1AA (1A) illustrated in FIG. 6 includes a substrate 50AA (50A) and the functional element 40A laid on the substrate 50AA. The substrate 50AA includes the substrate thin-film section 51, which has a thin film form and has a smaller thickness in the stacking direction of the substrate 50AA and functional element 40A than the thickness of the substrate 50AA in other directions. The substrate thin-film section 51 of the substrate 50AA is in physical contact with the functional element 40A.

(Functional Element)

The functional element 40A is an element that changes in physical property with changes in temperature and pressure. Specifically, the functional element 40A is an element composed of the functional titanium oxide that changes in physical property with variation in crystalline structure of crystal grains due to changes in temperature and pressure. The physical properties that vary with changes in temperature and pressure are one or more of electric conductivity and color, for example.

The functional titanium oxide refers to a titanium oxide material including a function of: varying in crystalline structure of crystal grains in response to at least heating; and maintaining after cooling, the crystal grains of the crystalline structure generated by the heating. Specifically, the functional titanium oxide includes the following function: the functional titanium oxide is heated to form crystal grains having a crystalline structure different from that at least before heating; and maintains after cooling, the crystal grains of the crystalline structure generated by the heating.

In addition to changes in temperature due to heating, the functional titanium oxide varies in crystalline structure of crystal grains with changes in pressure applied to the functional titanium oxide. Specifically, the functional titanium oxide further includes the function of: generating crystal grains having a crystalline structure different from that before pressurization; and maintaining the generated crystal grains of the different crystalline structure after the applied pressure is removed. Furthermore, the functional titanium oxide may further include the function of: generating crystal grains having a crystalline structure different from that before supply of current or light; and maintaining the generated crystal grains of the different crystalline structure after the supply of current or light is stopped.

The functional titanium oxide changes in physical property with variation in crystalline structure. The physical properties that change with variation in crystalline structure are color, electric conductivity, and the like. The relationship between variation in crystalline structure and physical properties, such as color and electric conductivity, in the functional titanium oxide is described later.

Figure 1:
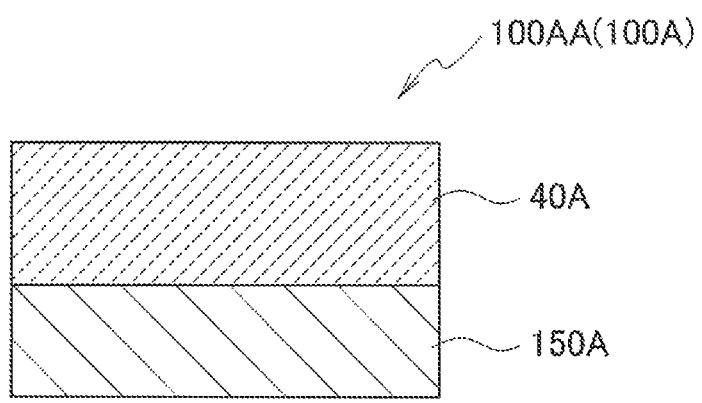
FIG. 1 is a schematic cross-sectional view illustrating a conventional temperature sensor example.
Figure 2:
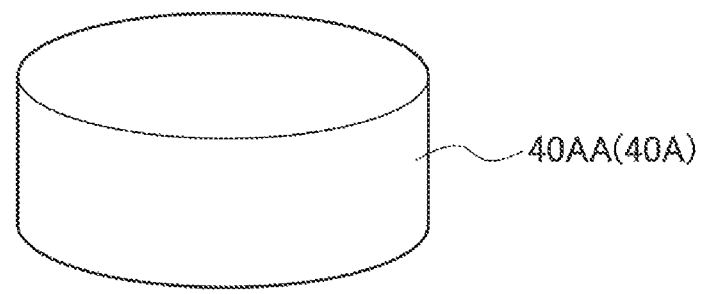
FIG. 2 is a schematic perspective view illustrating a functional element example.
Figure 3:
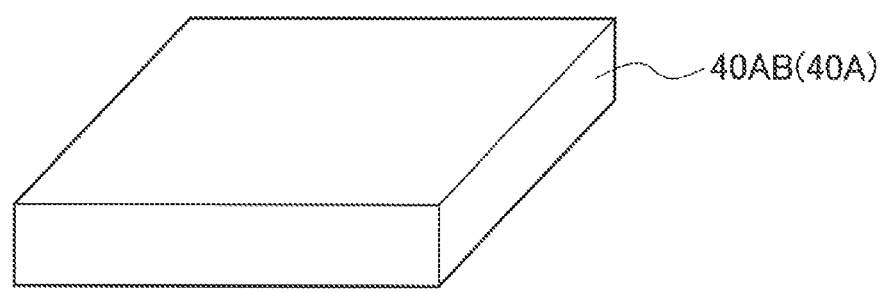
FIG. 3 is a schematic perspective view illustrating another functional element example.
Figure 4:
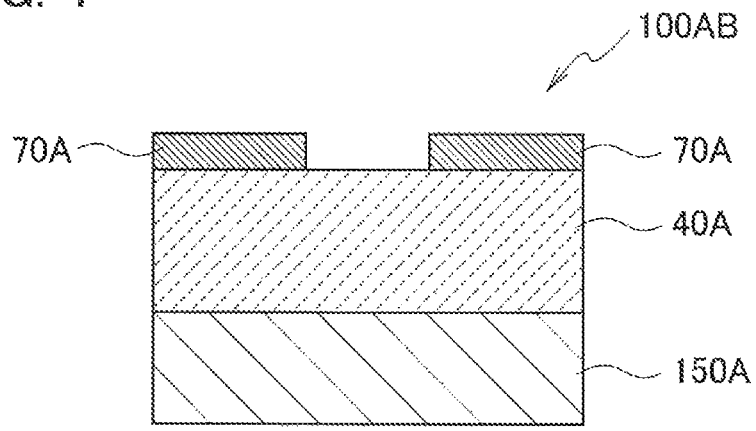
FIG. 4 is a schematic cross-sectional view illustrating another conventional temperature sensor example.
Figure 5:
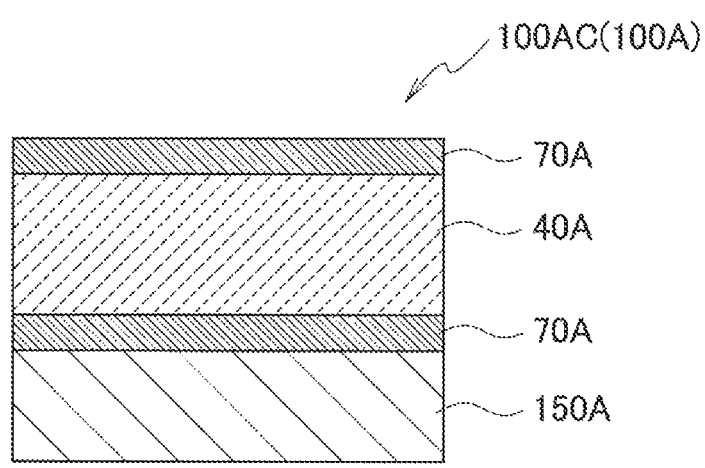
FIG. 5 is a schematic cross-sectional view illustrating still another conventional temperature sensor example.

The functional element 40A is substantially composed of only the functional titanium oxide. The minimum unit functioning as the functional titanium oxide is nanoparticles composed of crystal grains of the functional titanium oxide as described later. However, nanoparticles are difficult to handle. The functional titanium oxide is normally powder composed of polycrystal of nanoparticles of crystal grains. On the other hand, the functional element 40A used in the pressure sensor 1AA requires an area large enough to be laid on the substrate 50A. The powder composed of polycrystal does not form a large enough area. The functional element 40A is normally composed of a compact or a thin film made of powder composed of polycrystal of the functional titanium oxide. Such a compact is a thin plate-shaped pellet obtained by compressing powder of polycrystal of the functional titanium oxide, for example. The compact may be a molded body formed using a mold. The shape of the functional element 40A is not limited in particular. Examples of the shape of the functional element 40A include a columnar shape illustrated in FIG. 2 and a rectangular plate shape illustrated in FIG. 3. FIGS. 2 and 3 exaggerate the thickness for convenience of explanation. The thin film made of powder composed of polycrystal of the functional titanium oxide is a thin film formed by sputtering powder composed of polycrystal of the functional titanium oxide, for example.

The thickness of the functional element 40A is not limited particularly and is normally 1 nm to 10 μm and preferably 0.1 to 1.0 μm. The thickness of the functional element 40A is preferably within this range so that the functional element 40A sensitively detects slight changes in temperature and pressure.

(Crystalline Structure of Functional Titanium Oxide)

The crystalline structure of the functional titanium oxide as the material of the functional element 40A is described in detail below. The functional titanium oxide normally includes crystal grains of one or more of β-phase trititanium pentoxide (β-$Ti_3O_5$) and λ-phase trititanium pentoxide (λ-$Ti_3O_5$) at 450° C. or lower and normal pressure. The functional titanium oxide includes the following property: at least a portion of crystal grains of one or more of β-phase trititanium pentoxide and λ-phase trititanium pentoxide change into crystal grains of titanium dioxide ($TiO_2$) when the functional element 40A is heated to 350° C. or higher at normal pressure.

As described above, the functional titanium oxide varies in crystalline structure of crystal grains with changes in pressure, in addition to changes in temperature due to heating. Hereinafter, a description is given of the operations of the functional titanium oxide upon changes in temperature due to heating and changes in pressure.

(Operation of Functional Titanium Oxide Due to Temperature Change at Normal Pressure)

The operations of the functional titanium oxide in response to changes in temperature at normal pressure are described concretely. The functional element 40A composed of the functional titanium oxide of the embodiment is generally used as a temperature sensor as follows: the functional element 40A is normally treated at room temperature and normal pressure and measures the peak temperature when the functional element 40A is placed at high temperature. In the following description, it is assumed that crystal grains of the functional titanium oxide are at normal pressure, have not been heated to 190° C. or higher and are at lower than 190° C., and are composed of only β-phase trititanium pentoxide.

The functional titanium oxide can take one or more of three forms of β-phase trititanium pentoxide, λ-phase trititanium pentoxide, and titanium dioxide from a low-temperature range to a high-temperature range.

Specifically, the functional titanium oxide normally includes crystal grains of only β-phase trititanium pentoxide at lower than 190° C. The functional titanium oxide composed of β-phase trititanium pentoxide is normally polycrystal of crystal grains of β-phase trititanium pentoxide.

When the functional titanium oxide is heated to a temperature of not lower than 190° C. and lower than 350° C., at least a portion of the large number of crystal grains of β-phase trititanium pentoxide constituting the functional titanium oxide undergo phase transition into crystal grains of λ-phase trititanium pentoxide. Specifically, when the functional titanium oxide is heated to 190° C. or higher, 5 mol % or more of the crystal grains of β-phase trititanium pentoxide undergoes phase transition into crystal grains of λ-phase trititanium pentoxide.

In a temperature range not lower than 190° C. and lower than 350° C., the large number of crystal grains constituting the functional titanium oxide undergo phase transition from λ-phase trititanium pentoxide to β-phase trititanium pentoxide at varying times. The functional titanium oxide heated to a temperature of not lower than 190° C. and lower than 350° C. normally includes mainly crystal grains of λ-phase trititanium pentoxide and also includes crystal grains of β-phase trititanium pentoxide.

When the functional titanium oxide is heated to a temperature of not lower than 350° C. and not higher than 450° C., at least a portion of the large number of crystal grains of λ-phase trititanium pentoxide constituting the functional titanium oxide change in crystalline composition into crystal grains of titanium dioxide. Specifically, when crystal grains of λ-phase trititanium pentoxide are heated to 350° C. or higher, 5 mol % or more thereof undergoes phase transition into crystal grains of titanium dioxide.

Herein, titanium dioxide is an idea including rutile, anatase, and brookite. In a temperature range not lower than 350° C. and not higher than 450° C., the large number of crystal grains constituting the functional titanium oxide changes in crystalline composition from λ-phase trititanium pentoxide to titanium dioxide at varying times. The functional titanium oxide heated to a temperature of not lower than 350° C. and not hither than 450° C. normally includes mainly crystal grains of titanium dioxide and also includes crystal grains of λ-phase trititanium pentoxide and β-phase trititanium pentoxide.

When the functional titanium oxide including mainly crystal grains of λ-phase trititanium pentoxide and also including crystal grains of β-phase trititanium pentoxide is heated to a temperature of not lower than 350° C. and not higher than 450° C., similarly, crystal grains of titanium dioxide are generated in the functional titanium oxide. Specifically, crystal grains of β-phase trititanium pentoxide are heated to undergo phase transition into crystal grains of λ-phase trititanium pentoxide and then further change into crystal grains of titanium dioxide.

When heated to a temperature of higher than 450° C. and lower than 550° C., at least a portion of the large number of crystal grains of λ-phase trititanium pentoxide constituting the functional titanium oxide change into crystal grains of titanium dioxide, most crystal grains of which are white.

In a temperature range higher than 450° C. and lower than 550° C., the large number of crystal grains constituting the functional titanium oxide change in crystalline composition from λ-phase trititanium pentoxide to titanium dioxide at varying times. The functional titanium oxide heated to a temperature of higher than 450° C. and lower than 550° C. normally includes mainly crystal grains of titanium dioxide and also includes small amounts of crystal grains of λ- and β-phase trititanium pentoxide.

The temperature at which all of the large number of crystal grains of λ-phase trititanium pentoxide constituting the functional titanium oxide change to crystal grains of titanium dioxide is about 550° C. or higher. The functional titanium oxide heated to 550° C. or higher normally includes only crystal grains of titanium dioxide.

As described above, the stable crystalline structure of the functional titanium oxide depends on the temperature range. Once heated, the functional titanium oxide has the property of maintaining the crystalline structure of crystal grains generated by the heating, after cooling. Once the functional titanium oxide is heated to a high-temperature range and crystal grains of titanium dioxide are formed in crystal grains constituting the functional titanium oxide, the composition of the generated titanium dioxide is maintained even if the functional titanium oxide is cooled to room temperature.

β-phase trititanium pentoxide, λ-phase trititanium pentoxide, and titanium dioxide described above are different in physical properties. In terms of color among the physical properties, for example, β-phase trititanium pentoxide, λ-phase trititanium pentoxide, and titanium dioxide are different in color, which are red or brownish red, blue, and white, respectively.

When the functional titanium oxide used in a place changing in temperature is red or brownish red, blue, or white, it is possible to detect the peak temperature in the thermal history of the functional titanium oxide. Specifically, when the functional titanium oxide is red or brownish red, blue, or white, the functional titanium oxide is found to be β-phase trititanium pentoxide, λ-phase trititanium pentoxide, or titanium dioxide, respectively. When the functional titanium oxide is red or brownish red, the functional titanium oxide is found to have a thermal history with the peak temperature lower than 190° C. When the functional titanium oxide is blue, the functional titanium oxide is found to have a thermal history with the peak temperature not lower than 190° C. and lower than 350° C. When the functional titanium oxide is white, the functional titanium oxide is found to have a thermal history with the peak temperature not lower than 350° C. The functional titanium oxide can be therefore used as the material of temperature sensors or pressure sensors including a function of temperature sensors by examining variation in color.

Specifically, the functional titanium oxide that has not been heated to 190° C. or higher normally includes only β-phase trititanium pentoxide and is red or brownish red.

When the functional titanium oxide has been heated to a temperature of not lower than 190° C. and lower than 350° C., at least a portion of crystal grains of red or brownish red β-phase trititanium pentoxide of the functional titanium oxide undergo phase transition into crystal grains of blue λ-phase trititanium pentoxide.

When the functional titanium oxide has been heated to a temperature of not lower than 350° C. and not higher than 450° C., at least a portion of crystal grains of blue λ-phase trititanium pentoxide of the functional titanium oxide change in crystalline composition into crystal grains of white titanium dioxide.

When the functional titanium oxide has been heated to a temperature of higher than 450° C. and lower than 550° C., most of the crystal grains of the functional titanium oxide change into crystal grains of white titanium dioxide.

The functional titanium oxide that has been heated to a temperature of not lower than 550° C. normally includes only crystal grains of white titanium dioxide.

The color of the functional titanium oxide is evaluated visually or evaluated based on an adsorption spectrum thereof. The functional titanium oxide can be therefore used as the material of temperature sensors or pressure sensors serving as a temperature sensor by examining variation in color.

In terms of electric conductivity among the physical properties that change with variation in crystalline structure of the functional titanium oxide, β-phase trititanium pentoxide, λ-phase trititanium pentoxide, and titanium dioxide are different in electric conductivity. For example, β-phase trititanium pentoxide has an electric conductivity in the same range as that of many semiconductors while the λ-phase trititanium pentoxide has an electric conductivity in the same range as that of many metals. Titanium dioxide has an electric conductivity in the same range as that of many insulators. Such differences in electric conductivity are maintained even after the functional titanium oxide is cooled to room temperature. Changes in electric conductivity of the functional titanium oxide are known by measuring electric resistance between two or more electrodes across the functional titanium oxide, for example.

Measurement of the electric conductivity of the functional titanium oxide shows that the functional titanium oxide has been heated to a temperature in a temperature range lower than 190° C., a temperature range not lower than 190° C. and lower than 350° C., or a temperature range not lower than 350° C. The functional titanium oxide can be therefore used as the material of temperature sensors and pressure sensors also serving as a temperature sensor.

Changes in crystalline structure of the functional titanium oxide between β-phase trititanium pentoxide, λ-phase trititanium pentoxide, and titanium dioxide are not substantially influenced by the atmosphere in which the functional titanium oxide is used. For example, the functional titanium oxide can be used in an atmosphere, such as air, oxygen atmosphere, or nitrogen atmosphere.

As described above, the functional titanium oxide includes the function of: changing in crystalline structure of crystal grains due to at least heating; and maintaining the crystal grains of the crystalline structure generated by the heating, after cooling. The function of: changing in crystalline structure of crystal grains due to at least heating; and maintaining the crystal grains of the crystalline structure generated by the heating, after cooling is also referred to as a "function as the functional titanium oxide" hereinafter.

(Average Grain Size of Functional Titanium Oxide Crystal Grain)

In the functional titanium oxide, the minimum unit including the function as the functional titanium oxide is nanoparticles of crystal grains. The crystal grains constituting the functional titanium oxide that has not been heated to 190° C. or higher at normal pressure are normally composed of only β-phase trititanium pentoxide as described above.

The average grain size (median size) of crystal grains of β-phase trititanium pentoxide, that is, crystal grains of the functional titanium oxide is normally 1 to 100 nm, preferably 5 to 50 nm, and more preferably 10 to 20 nm. When the average grain size of crystal grains of β-phase trititanium pentoxide is in the aforementioned range, the functional titanium oxide includes the aforementioned function as the functional titanium oxide. The functional titanium oxide is suitable for temperature sensors capable of showing the peak temperature in the thermal history after cooling and pressure sensors serving as a temperature sensor.

In the functional titanium oxide, the minimum unit including the function as the functional titanium oxide is crystal grains having an average grain size in the aforementioned range. However, crystal grains as nanoparticles are difficult to handle, and the functional titanium oxide is preferably polycrystal of nanoparticles of crystal grains. This polycrystal of nanoparticles of crystal grains can take any form and is granular, for example. The average particle size (median size) of the granular polycrystal of crystal grains is typically 50 nm to 500 μm, preferably 1 to 50 μm, and more preferably 3 to 8 μm, for example. If the average particle size (median size) of the granular polycrystal of crystal grains is in the aforementioned range, the functional titanium oxide is easy to handle.

The functional element 40A of the pressure sensor 1AA according to the first embodiment is a thin-plate pellet obtained by compressing polycrystal of crystal grains of the functional titanium oxide, such as the above granular polycrystal of crystal grains.

The size of crystal grains of β-phase trititanium pentoxide constituting the functional titanium oxide is thought to substantially not change even if phase transition from β- to λ-phase trititanium pentoxide is caused by heating. The size of crystal grains of β-phase trititanium pentoxide constituting the functional titanium oxide can be therefore considered equal to the size of crystal grains of β- and λ-phase trititanium pentoxide constituting the functional titanium oxide.

On the other hand, conventional trititanium pentoxide, such as trititanium pentoxide composed of polycrystal of crystal grains which are not nanoparticles and monocrystalline trititanium pentoxide, does not have the property of maintaining the crystalline structure of crystal grains generated by heating, after cooling, unlike the functional titanium oxide. This is considered to be because, crystal grains of normal trititanium pentoxide reversibly and easily change in crystalline structure between β-phase trititanium pentoxide, λ-phase trititanium pentoxide, and titanium dioxide. Conventional trititanium pentoxide is not a suitable material for temperature sensors that show the peak temperature in the thermal history after cooling and pressure sensors serving as a temperature sensor.

On the other hand, trititanium pentoxide constituting the pressure sensor 1AA according to the first embodiment is the functional titanium oxide and is suitable as the material of temperature sensors and pressure sensors serving as a temperature sensor.

(Operation of Functional Titanium Oxide Due to Pressure Change at Room Temperature)

In addition to the aforementioned function of changing in crystalline structure due to heating, the functional titanium oxide further includes the function of: when pressurized, generating crystal grains having a crystalline structure different from that before pressurization; and maintaining the generated crystal grains of the different crystalline structure after the applied pressure is removed.

The operations of the functional titanium oxide due to changes in pressure at room temperature are descried below concretely. In the following description, it is assumed that crystal grains constituting the functional titanium oxide are at room temperature and have not been pressurized to 60 MPa or higher. The functional titanium oxide can take two forms among λ-phase trititanium pentoxide, β-phase trititanium pentoxide, and titanium dioxide from a low-pressure region to a middle-to-high pressure region.

Specifically, the functional titanium oxide normally includes crystal grains of only λ-phase trititanium pentoxide at lower than 60 MPa. The functional titanium oxide composed of λ-phase trititanium pentoxide is normally polycrystal of crystal grains of λ-phase trititanium pentoxide. When the functional titanium oxide is pressurized to 60 MPa or higher, at least a portion of the large number of crystal grains of λ-phase trititanium pentoxide constituting the functional titanium oxide undergo phase transition into crystal grains of β-phase trititanium pentoxide. Specifically, when the functional titanium oxide is pressurized to 60 MPa or higher, 5 mol % or more of the crystal grains of λ-phase trititanium pentoxide of the functional titanium oxide undergo phase transition into crystal grains of β-phase trititanium pentoxide.

As described above, the stable crystalline structure of the functional titanium oxide depends on the pressure range. Once pressurized, the functional titanium oxide includes the property of maintaining the crystalline structure of crystal grains generated by pressurization, after the applied pressure is removed. Once crystal grains of λ-phase trititanium pentoxide of the functional titanium oxide are pressurized to 60 MPa or higher into crystal grains of β-phase trititanium pentoxide, the composition of the generated β-phase trititanium pentoxide is maintained even after the applied pressure is reduced to lower than 60 MPa.

Specifically, the functional titanium oxide that has not been pressurized to 60 MPa or higher is normally composed of only λ-phase trititanium pentoxide and is blue.

When the functional titanium oxide that has been pressurized to 60 MPa or higher, at least a portion of crystal grains of blue λ-phase trititanium pentoxide of the functional titanium oxide undergo phase transition into crystal grains of red or brownish red β-phase trititanium pentoxide.

When the functional titanium oxide is blue, it is determined that the functional titanium oxide has not been pressurized to 60 MPa or higher. When the functional titanium oxide is red or brownish red, it is determined that the functional titanium oxide has been pressurized to 60 MPa or higher. The color of the functional titanium oxide is evaluated visually or evaluated based on the adsorption spectrum thereof. The functional titanium oxide can be also used as the material of pressure sensors by examining variation in color.

(Operation of Functional Element)

The functional element 40A is a thin-plate pellet of powder of the functional titanium oxide and is composed of the functional titanium oxide. The operations of the functional element 40A are the same as those of the functional titanium oxide. Specifically, the functional element 40A provides the same operations as "Operation of Functional titanium oxide due to Temperature Change at Normal Pressure" and "Operation of Functional titanium oxide due to Pressure Change at Room Temperature" of the functional titanium oxide and operates as a temperature sensor and a pressure sensor. The operations of the functional element 40A are the same as those of the functional titanium oxide, and the description thereof is omitted.

(Substrate)

The substrate 50AA (50A) serves as the base to form the functional element 40A and the like in the process of manufacturing the pressure sensor 1AA. The substrate 50AA includes an operation of giving the pressure sensor 1AA mechanical strength and controlling the properties including the thermal conduction and electric conduction. In addition, the substrate 50AA includes the substrate thin-film section 51 having a thin film form, through which the functional element 40A easily detects slight changes in temperature and pressure sensitively.

As illustrated in FIG. 6, the substrate 50AA includes: the substrate thin-film section 51 having a thin film form; a substrate peripheral section 53 which does not have a thin film form; and a substrate wall section 52 connecting the substrate thin-film section 51 and the substrate peripheral section 53.

The substrate 50AA includes: the substrate thin-film section 51 which has a disk-shaped or rectangular thin-film form; the substrate wall section 52 which diagonally stands up from the outer edge of the substrate thin-film section 51; and the substrate peripheral section 53 which is formed so as to extend horizontally in the outside from the outer circumference of the outer edge of the substrate wall section 52 and has a non-thin-film form.

The substrate thin-film section 51 is a thin film-like section in which the thickness of the substrate 50AA in the stacking direction of the substrate 50AA and functional element 40A is smaller than that of the substrate 50AA in other directions. The stacking direction of the substrate 50AA and functional element 40A corresponds to the vertical direction in FIG. 6. The other directions are directions different from the stacking direction. For example, the other directions include a vertical direction to the stacking direction of the substrate 50AA and functional element 40A in FIG. 6, that is, the horizontal direction in FIG. 6. The horizontal direction in FIG. 7 described later in the second embodiment and the horizontal direction in FIG. 8 described later in the third embodiment are also included in the aforementioned other directions. The thickness of the substrate thin-film section 51 in the stacking direction of the substrate 50AA and functional element 40A is normally 1 to 100 am, preferably 5 to 50 am, more preferably 7 to 15 am, and still more preferably 8 to 12 am. The thickness of the substrate 50A is preferably within this range so that the functional element 40A detects a slight change in temperature and pressure easily and sensitively.

The substrate wall section 52 and substrate peripheral section 53 are sections to reinforce the substrate 50AA including the substrate thin-film section 51 and keep the form of the substrate thin-film section 51. By including the substrate wall section 52 and substrate peripheral section 53 of high mechanical strength in addition to the substrate thin-film section 51, the substrate 50AA is able to support the functional element 40A with high strength.

The thickness of the substrate peripheral section 53 in the stacking direction of the substrate 50AA and functional element 40A, which is not limited particularly, is normally 0.1 to 5.0 mm and preferably 0.7 to 1.0 mm, for example. The thickness of the substrate peripheral section 53 is preferably within this range so that the substrate 50AA has high mechanical strength and is easily used in processing apparatuses.

In the substrate 50AA, the substrate thin-film section 51 is an essential component while the substrate wall section 52 and substrate peripheral section 53 are optional components. As a not-illustrated modification of the substrate 50AA, the substrate 50A can be composed of only the substrate thin-film section 51.

The substrate 50AA is made of one or more materials selected from a group consisting of semiconductors, silicon on insulator (SOI), oxides, metals, and polyimide resins, for example. The semiconductors are Si, SiC, GaN, and the like. Examples of the SOI include publicly-known SOI. The oxides are inorganic oxides, such as sapphire, Nb—$SrTiO_3$, and La—$SrTiO_3$. Nb—$SrTiO_3$ and La—$SrTiO_3$ are strontium titanium oxide doped with Nb or La and are conducting oxides. The metals are Al, Cu, Ti, Ni, Sn, Au, Ag, SUS, and the like. The fibers are glass fibers or carbon fibers. The substrate 50AA is preferably made of the aforementioned materials. This facilitates formation of the functional element 40A and the like and facilitates fabrication of a number of identical elements on the same substrate.

SOI includes two or more components, including an Si substrate and an embedding insulator layer. When the substrate 50AA is made of SOI, the SOI structure is not necessarily composed of only the substrate thin-film section 51 and can be composed of the whole substrate 50AA including sections other than the substrate thin-film section 51.

(Formation of Substrate Thin-Film Section)

The substrate 50AA including the substrate thin-film section 51 can be fabricated by a publicly-known method. Specifically, the substrate 50AA is fabricated by a method of: using as the raw material, a flat substrate on which the substrate thin-film section 51 is not formed; and thinning a part of the flat substrate to form the substrate thin-film section 51. The thinning method can be a publicly-known method. Specific examples of the thinning method are wet etching using anisotropy of Si and dry etching such as reactive ion etching. In the case of using wet etching, the etching stop layer can be an oxide film, such as $SiO_2$ film, included in the SOI wafer and nitride film such as $Si_3N_4$ film, for example. The thinning is normally performed for a part of the surface of the flat substrate. The functional element is then laid on the substrate.

(Operation of Pressure Sensor)

Among the operations of the pressure sensor 1AA, the operations of the functional element 40A are as described in "Operation of Functional Element" above. The functional element 40A of the pressure sensor 1AA then operates as a temperature sensor and a pressure sensor. The pressure sensor 1AA including the functional element 40A therefore operates as a pressure sensor serving as a temperature sensor. Among the operations of the pressure sensor 1AA, the description of the operations of the functional element 40A is omitted.

In addition to the operations of the functional element 40A, the pressure sensor 1AA includes the operations due to the substrate 50AA. Hereinafter, the operations due to the substrate 50AA are described.

In the pressure sensor 1AA, the substrate 50AA and functional element 40A are made of different materials and have different interatomic spacings. When the substrate 50AA is laid on the functional element 40A so as to be in physical contact with the same, therefore, shear stress occurs in the interface between the substrate 50AA and functional element 40A. Specifically, the substrate 50AA normally applies shear stress to the functional element 40A so as to increase the interatomic spacing in the interface of the functional element 40A. In a pressure sensor including a conventional flat substrate having a thickness of about 0.7 to 1.0 mm, therefore, the sear stress is more likely to cause separation of the substrate from the functional element 40A, cracks in the functional element 40A, and the like.

In the pressure sensor 1AA, the substrate thin-film section 51 having a thin-film form occupies most of the area of the interface between the substrate 50AA and functional element 40A. This reduces the shear stress applied by the substrate thin-film section 51 to the interface between the substrate thin-film section 51 and functional element 40A when the pressure sensor 1AA is not heated or cooled. In addition, the substrate thin-film section 51 has a thin-film form. This reduces the shear stress due to the difference in thermal expansion coefficient between the substrate thin-film section 51 and functional element 40A in the process of heating or cooling. In the pressure sensor 1AA, it is therefore possible to prevent or reduce separation of the substrate 50AA from the functional element 40A and cracks in the functional element 40A when the pressure sensor 1AA is heated or cooled and is not heated or cooled.

When the substrate has a thickness of about 0.7 to 1.0 mm like the conventional technique, strong shear stress acts on the entire functional element 40A due to the substrate, and the functional element 40A is less likely to bend. In the pressure sensor 1AA, the substrate thin-film section 51, which is in physical contact with the functional element 40A, has a thin-film form. This reduces shear stress applied to the functional element 40A by the substrate 50AA, and the functional element 40A is more likely to bend. In the pressure sensor 1AA, the functional element 40A is likely to bend with slight pressure such as ultrasonic pressures. The pressure sensor 1AA is therefore able to detect slight pressures such as ultrasonic pressures.

(Effect of Pressure Sensor)

According to the pressure sensor 1AA, it is possible to measure temperature and pressure by using changes in physical property due to variation in the crystalline structure of crystal grains of the functional titanium oxide constituting the functional element 40A. According to the pressure sensor 1AA, it is possible to provide a pressure sensor serving as a temperature sensor.

The functional titanium oxide constituting the functional element 40A is inexpensive. According to the pressure sensor 1AA, it is possible to provide an inexpensive pressure sensor serving as a temperature sensor.

In addition, in the pressure sensor 1AA, the substrate thin-film section 51, which is in physical contact with the functional element 40A, has a thin-film form. This reduces the shear stress produced in the process of heating or cooling due to the difference in thermal expansion coefficient between the substrate thin-film section 51 and functional element 40A. According to the pressure sensor 1AA, it is therefore possible to prevent or reduce separation of the substrate 50AA from the functional element 40A and cracks in the functional element 40A in the process of heating or cooling.

In the pressure sensor 1AA, since the substrate thin-film section 51, which is in physical contact with the functional element 40A, has a thin-film form, the substrate thin-film section 51 applies small shear stress to the interface between the functional element 40A and the substrate thin-film section 51 when the pressure sensor 1AA is not heated or cooled. According to the pressure sensor 1AA, it is therefore possible to prevent or reduce separation of the substrate 50AA from the functional element 40A and cracks in the functional element 40A when the pressure sensor 1AA is not heated or cooled.

The pressure sensor 1AA serves as a temperature sensor and is able to measure temperatures in a high-temperature range not lower than 350° C. According to the pressure sensor 1AA, it is possible to measure temperatures in electric furnaces, switchboards, and the like, which require temperature measurement in a high-temperature range not lower than 350° C.

In the pressure sensor 1AA, since the substrate thin-film section 51, which is in physical contact with the functional element 40A, has a thin-film form, the functional element 40A is more likely to bend. According to the pressure sensor 1AA, it is possible to detect slight pressures such as ultrasonic pressures.

The pressure sensor 1AA includes an inexpensive functional element which changes in physical property with changes in temperature and pressure. According to the pressure sensor 1AA, it is therefore possible to provide an inexpensive pressure sensor which serves as a temperature sensor and in which separation of the substrate from the functional element and cracks in the functional element are prevented or reduced.

Second Embodiment

Figure 7:
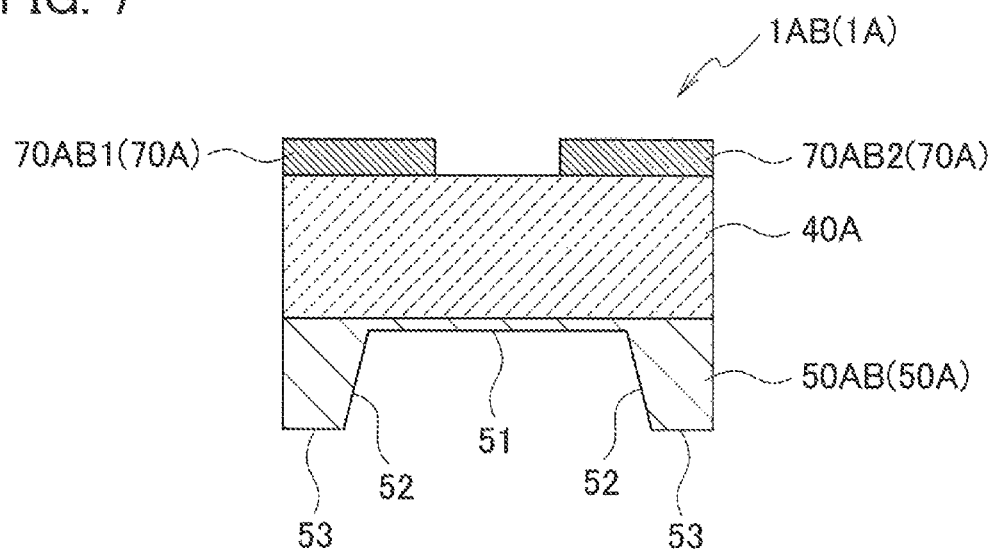
FIG. 7 is a schematic cross-sectional view illustrating a pressure sensor according to a second embodiment.

FIG. 7 is a schematic cross-sectional view illustrating the pressure sensor according to the second embodiment. A pressure sensor 1AB (1A) illustrated in FIG. 7 includes a substrate 50AB (50A) and a functional element 40A laid on the substrate 50AB. The substrate 50AB includes a substrate thin-film section 51 of a thin-film form in which the thickness of the substrate 50AB in the stacking direction of the substrate 50AB and functional element 40A is smaller than that of the substrate 50AB in other directions. The substrate thin-film section 51 of the substrate 50AB is in physical contact with the functional element 40A. The pressure sensor 1AB further includes electrodes 70A, which include two electrodes 70AB1 and 70AB2 on the surface of the functional element 40A.

The pressure sensor 1AB according to the second embodiment (illustrated in FIG. 7) is the same as the pressure sensor 1AA according to the first embodiment (illustrated in FIG. 6), excepting that the electrodes 70AB1 and 70AB2 are provided on the surface of the functional element 40A. The same members of the pressure sensor 1AB according to the second embodiment (illustrated in FIG. 7) as those of the pressure sensor 1AA according to the first embodiment (illustrated in FIG. 6) are given the same reference symbols, and the description of the configurations and operations thereof is omitted.

The substrate 50AB (50A) of the pressure sensor 1AB according to the second embodiment is the same as the substrate 50AA (50A) of the pressure sensor 1AA according to the first embodiment, and the description thereof is omitted.

(Electrode)

The pressure sensor 1AB includes the electrodes 70AB1 and 70AB2 (70A) on the surface of the functional element 40A. The electrodes 70A electrically connect to the surface of the functional element 40A. As described above, the functional element 40A changes in physical property, such as electric conductivity, with variation in crystalline structure of crystal grains due to changes in temperature or pressure. The electrodes 70AB1 and 70AB2 detect changes in electric conductivity near the surface of the functional element 40A with variation in crystalline structure of crystal grains due to changes in temperature and pressure.

In the pressure sensor 1AB, the above-described arrangement of the electrodes 70AB1 and 70AB2 allows for detection of changes in electric conductivity near the surface of the functional element 40A.

The electrodes 70AB1 and 70AB2 are arranged in at least a part of the surface of the functional element 40A. Specifically, the electrodes 70AB1 and 70AB2 are provided apart from each other on the surface (on the upper side in FIG. 7) of the functional element 40A. The number of the electrodes 70A can be two or more, including the electrodes 70AB1 and 70AB2. As a modification of the temperature sensor 1AB, not-illustrated two electrodes 70A may be further provided on the surface (on the upper side in FIG. 7) of the functional element 40A, in addition to the electrodes 70AB1 and 70AB2, for example. By providing the four electrodes 70A on the surface (on the upper side in FIG. 7) of the functional element 40A as described above, changes in electric conductivity of the functional element 40A can be precisely detected with four-terminal sensing.

The electrodes 70AB1 and 70AB2 are made of one or more materials selected from a group consisting of metals, conducting oxides, carbon materials, and conducting polymers, for example. The metals are Al, Ag, Au, Cu, Pt, and the like. The conducting oxides are ITO (indium tin oxide) and the like. The carbon materials are graphite (black lead) and the like. The conducting polymers are polythiophene polymers, polyaniline polymers, polyacetylene polymers, and the like. The electrodes 70A are preferably made of the aforementioned materials for easy electric conduction between the functional element 40A and electrodes 70A.

The thickness of the electrodes 70AB1 and 70AB2, which is not limited particularly, is normally 0.01 to 1000 am and preferably 0.1 to 100 am. The electrodes 70AB1 and 70AB2 preferably have thicknesses within the aforementioned range so as to ensure electric conduction.

(Operation of Pressure Sensor)

The pressure sensor 1AB according to the second embodiment (illustrated in FIG. 7) exerts the same operations as those of the pressure sensor 1AA according to the first embodiment (illustrated in FIG. 6).

In the pressure sensor 1AB, the substrate thin-film section 51 having a thin-film form occupies most of the area of the interface between the substrate 50AB, which is laid on and is in physical contact with the functional element 40A, and the functional element 40A. This reduces the shear stress applied by the substrate thin-film section 51 to the interface between the substrate thin-film section 51 and functional element 40A when the pressure sensor 1AB is not heated or cooled. In addition, the substrate thin-film section 51 has a thin-film form. This reduces the shear stress generated in the process of heating or cooling due to the difference in thermal expansion coefficient between the substrate thin-film section 51 and functional element 40A. In the pressure sensor 1AB, it is therefore possible to prevent or reduce separation of the substrate 50AB from the functional element 40A or electrodes 70A and cracks in the functional element 40A and electrodes 70A when the temperature sensor 1AB is heated or cooled and is not heated or cooled.

The pressure sensor 1AB, which includes the electrodes 70AB1 and 70AB2 (70A), detects a change in electric conductivity near the surface of the functional element 40A to detect the crystalline structure of crystal grains of the functional element 40A, thus detecting the peak temperature in the thermal history and the peak pressure in the pressure history.

The electrodes 70AB1 and 70AB2 are located on the opposite side of the functional element 40A from the substrate thin-film section 51. These electrode 70A do not interfere with transmission of slight pressure, such as ultrasonic pressures, applied to the substrate thin-film section 51 to the functional element 40A, which is in physical contact with the substrate thin-film section 51. The temperature sensor 1AB detects a change in electric conductivity of the functional element 40A to detect slight pressures, such as ultrasonic pressures, applied to the substrate thin-film section 51, thus detecting the peak temperature in the thermal history and the peak pressure in the pressure history.

In the pressure sensor 1AB, the substrate thin-film section 51 receives ultrasonic waves, and the pressure of the ultrasonic waves is transmitted to the functional element 40A through the substrate thin-film section 51. The functional element 40A changes in electric conductivity due to the ultrasonic pressure, and the change in electric conductivity of the functional element 40A is known by measuring electric resistance between two or more electrodes across the functional element 40A, for example. The pressure sensor 1AB is used as a pressure sensor in such a manner that the substrate thin-film section 51 receives ultrasonic waves and electric resistance between the two or more electrodes 70A and 70A across the functional element 40A is measured.

(Effect of Pressure Sensor)

The pressure sensor 1AB exerts the same effects as those of the pressure sensor 1AA according to the first embodiment (illustrated in FIG. 6).

In addition, the substrate thin-film section 51, which is in physical contact with the functional element 40A, has a thin-film form. The pressure sensor 1AB is less subject to shear stress due to the difference in thermal expansion coefficient between the substrate thin-film section 51 and functional element 40A in the process of heating or cooling. According to the pressure sensor 1AB, it is therefore possible to prevent or reduce separation of the substrate 50AB from the functional element 40A and electrodes 70A and cracks in the functional element 40A and electrodes 70A when the pressure sensor 1A is heated or cooled.

Furthermore, in the pressure sensor 1AB, since the substrate thin-film section 51, which is in physical contact with the functional element 40A, has a thin-film form, the substrate thin-film section 51 applies small shear stress to the functional element 40A when the pressure sensor 1AB is not heated or cooled. According to the pressure sensor 1AB, it is therefore possible to prevent or reduce separation of the substrate 50AB from the functional element 40A or electrodes 70A and cracks in the functional element 40A and electrodes 70A when the pressure sensor 1AB is not heated or cooled.

Still furthermore, the pressure sensor 1AB includes the electrodes 70AB1 and 70AB2 (70A). The pressure sensor 1AB is able to detect a change in electric conductivity near the surface of the functional element 40A to detect the crystalline structure of crystal grains of the functional element 40A, thus detecting the peak temperature in the thermal history and the peak pressure in the pressure history.

The pressure sensor 1AB includes the inexpensive functional element that changes in physical property with changes in temperature and pressure. According to the pressure sensor 1AB, therefore, it is possible to provide an inexpensive pressure sensor which serves as a temperature sensor and in which separation of the substrate from the functional element or electrodes and cracks in the functional element and electrodes are prevented or reduced.

Third Embodiment

Figure 8:
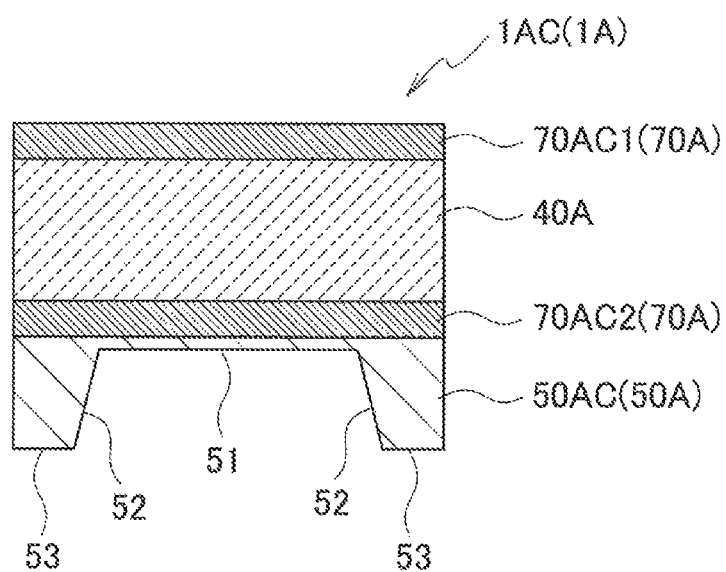
FIG. 8 is a schematic cross-sectional view illustrating a pressure sensor according to a third embodiment.

FIG. 8 is a schematic cross-sectional view illustrating the pressure sensor according to the third embodiment. A pressure sensor 1AC(1A) (illustrated in FIG. 8) includes a substrate 50AC (50A) and a functional element 40A laid on the substrate 50AC with an electrode 70AC2 interposed therebetween. The substrate 50AC includes a substrate thin-film section 51 of a thin-film form that has a smaller thickness in the stacking direction of the substrate 50AC and functional element 40A than that of the substrate 50AC in other directions. The pressure sensor 1AC further includes electrodes 70A. The electrodes 70A include: an electrode 70AC1 provided on the surface of the functional element 40A; and the electrode 70AC2 provided in the interface between the substrate 50AC and functional element 40A. The substrate thin-film section 51 of the substrate 50AC is not in physical contact with the functional element 40A since the electrode 70A is interposed therebetween.

The pressure sensor 1AC according to the third embodiment (illustrated in FIG. 8) is different from the pressure sensor 1AB according to the second embodiment (illustrated in FIG. 7) in that the electrode 70AC1 is provided on the surface of the functional element 40A. In addition, the pressure sensor 1AC according to the third embodiment (illustrated in FIG. 8) is different from the pressure sensor 1AB according to the second embodiment (illustrated in FIG. 7) in that the electrode 70AC2 is provided in the interface between the substrate 50AC and functional element 40A. The pressure sensor 1AC according to the third embodiment is the same as the pressure sensor 1AB according to the second embodiment in the other points. The same members of the pressure sensor 1AC according to the third embodiment (illustrated in FIG. 8) as those of the pressure sensor 1AB according to the second embodiment (illustrated in FIG. 7) are given the same reference symbols, and the description of the configurations and operations thereof is omitted.

The substrate 50AC (50A) of the pressure sensor 1AC according to the third embodiment is the same as the substrate 50AA (50A) of the pressure sensor 1AA according to the first embodiment, and the description thereof is omitted.

(Electrode)

The pressure sensor 1AC includes: the electrode 70AC1 provided on the surface of the functional element 40A; and the electrode 70AC2 provided in the interface between the substrate 50AC and functional element 40A. The electrode 70AC2 is provided in the interface between the substrate 50AC and functional element 40A. The electrodes 70AC1 and 70AC2 are arranged so as to sandwich the functional element 40A.

In the pressure sensor 1AC, the above-described arrangement of the electrodes 70AC1 and 70AC2 allows for detection of a change in electric conductivity in the vertical direction to the surface of the functional element 40A.

The electrodes 70AC1 and 70AC2 are arranged so as to cover the entire front and back surfaces of the functional element 40A. In other words, the lengths of the electrode 70AC1 and 70AC2 in width and depth in FIG. 8 are the same as the lengths of the functional element 40A in width and depth.

As a modification of the pressure sensor 1AC, one or more of the electrodes 70AC1 and 70AC2 can be formed so as to partially cover the surface of the functional element 40A. In other words, the lengths of the electrodes 70AC1 and 70AC2 in width and depth in FIG. 8 may be shorter than the lengths of the functional element 40A in width and depth. According to this modification, it is possible to measure the electric conductivity of the functional element 40A or the like in a section sandwiched by the electrodes 70AC1 and 70AC2 in the functional element 40A.

The electrodes 70A electrically connect to the front and rear surfaces of the functional element 40A. As described above, the functional element 40A changes in physical property, such as electric conductivity, with variation in crystalline structure of crystal grains due to changes in temperature or pressure. The electrodes 70AC1 and 70AC2 detect a change in electric conductivity in the vertical direction to the surfaces of the functional element 40A with variation in crystalline structure of crystal grains due to a change in temperature or pressure.

The number of the electrodes 70A can be two or more, including the electrodes 70AC1 and 70AC2. Specifically, one or more of the electrodes 70A may be provided on the surface of the functional element 40A while one or more of the electrodes 70A is provided in the interface between the substrate 50AC and functional element 40A. Specifically, as a modification of the pressure sensor 1AC, one or more not-illustrated electrodes 70A may be further provided apart from the electrodes 70AC1 and 70AC2, in addition to the electrodes 70AC1 and 70AC2, for example. The many electrodes 70A provided in such a manner allow for precise detection of changes in electric conductivity of the functional element 40A.

The electrodes 70AC1 and 70AC2 are made of the same material as that of the electrodes 70AB1 and 70AB2 of the pressure sensor 1AB according to the second embodiment (illustrated in FIG. 7). The thickness of the electrodes 70AC1 and 70AC2 is the same as that of the electrodes 70AB1 and 70AB2 of the pressure sensor 1AB according to the second embodiment (illustrated in FIG. 7).

(Operation of Pressure Sensor)

The pressure sensor 1AC according to the third embodiment (illustrated in FIG. 8) exerts the same operations as those of the pressure sensor 1AA according to the first embodiment (illustrated in FIG. 6).

In the pressure sensor 1AC, the substrate thin-film section 51 is not in contact with the functional element 40A unlike the pressure sensor 1AB according to the second embodiment (illustrated in FIG. 7). In the pressure sensor 1AC, therefore, the substrate thin-film section 51 does not apply shear stress to the functional element 40A in the interface between the substrate thin-film section 51 and functional element 40A when the pressure sensor 1AC is not heated or cooled. In addition, the difference in thermal expansion coefficient between the substrate thin-film section 51 and functional element 40C does not produce shear stress in the process of heating or cooling. In the pressure sensor 1AC, it is therefore possible to prevent or reduce separation of the substrate 50AC from the functional element 40A or electrodes 70A and cracks in the functional element 40A and electrodes 70A.

The pressure sensor 1AC includes the electrodes 70AC1 and 70AC2 (70A). According to the pressure sensor 1AC, it is possible to detect a change in electric conductivity in the vertical direction to the surface of the functional element 40A to detect the crystalline structure of crystal grains of the functional element 40A, thus detecting the peak temperature in the thermal history and the peak pressure in the pressure history.

In the pressure sensor 1AC, the electrode 70AC2 is provided in the interface between the substrate thin-film section 51 and functional element 40A, and the substrate thin-film section 51 and functional element 40A are not in physical contact. In the temperature sensor 1AC, slight pressures, such as ultrasonic pressures, applied to the substrate thin-film section 51 can be therefore attenuated by the electrode 70AC2 before reaching the functional element 40A. This can degrade the ability of the pressure sensor 1AC to detect slight pressures, such as ultrasonic pressures, compared with the pressure sensors 1AA and 1AB according to the first and second embodiments. However, the pressure sensor 1AC has an ability to detect pressures greater than ultrasonic pressures.

(Effect of Pressure Sensor)

The pressure sensor 1AC exerts the same effects as those of the pressure sensor 1AA according to the first embodiment (illustrated in FIG. 6).

In addition, in the pressure sensor 1AC, since the substrate thin-film section 51 is not in physical contact with the functional element 40A, the difference in thermal expansion coefficient between the substrate thin-film section 51 and functional element 40A does not produce shear stress in the process of heating or cooling. According to the pressure sensor 1AC, it is therefore possible to prevent or reduce separation of the substrate 50AC from the functional element 40A or electrodes 70A and cracks in the functional element 40A and electrodes 70A in the process of heating or cooling.

In the pressure sensor 1AC, since the substrate thin-film section 51 is not in physical contact with the functional element 40A, the substrate thin-film section 51 does not apply shear stress to the interface between the substrate thin-film section 51 and functional element 40A when the pressure sensor 1AC is not heated or cooled. According to the pressure sensor 1AC, it is therefore possible to prevent or reduce separation of the substrate 50AC from the functional element 40A or electrodes 70A and cracks in the functional element 40A and electrodes 70A when the pressure sensor 1AC is not heated or cooled.

The pressure sensor 1AC includes the electrodes 70AC1 and 70AC2 (70A). According to the pressure sensor 1AC, it is therefore possible to detect a change in electric conductivity in the vertical direction to the surface of the functional element 40A to detect the crystalline structure of crystal grains of the functional element 40A, thus detecting the peak temperature in the thermal history and the peak pressure in the pressure history.

The pressure sensor 1AC includes the inexpensive functional element that changes in physical property with changes in temperature and pressure. According to the pressure sensor 1AC, therefore, it is possible to provide an inexpensive pressure sensor which serves as a temperature sensor and in which separation of the substrate from the functional element and electrodes and cracks in the functional element and electrodes are prevented or reduced.

<Second Pressure Sensor>

Next, a description is given of a second pressure sensor with reference to the drawings.

(Pressure Sensor)

Figure 10:
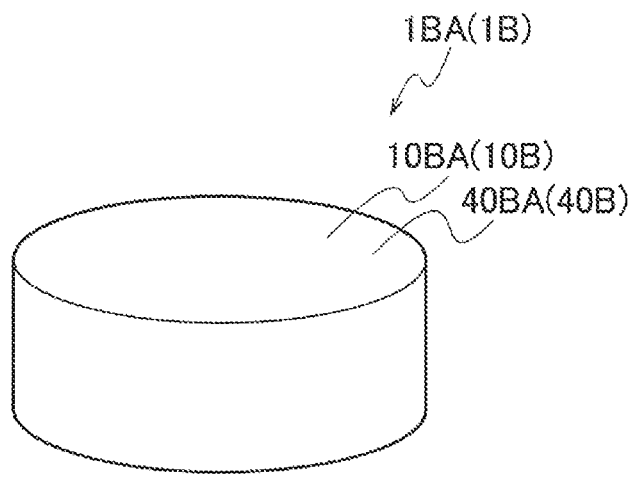
FIG. 10 is a schematic perspective view illustrating a pressure sensor according to a fourth embodiment.

FIG. 10 is a schematic perspective view illustrating a pressure sensor according to a fourth embodiment. A pressure sensor 1BA (1B) (illustrated in FIG. 10) includes a pressure sensor body 10BA (10B). The pressure sensor 1BA needs to include at least the pressure sensor body 10BA illustrated in FIG. 10 and may further include a not-illustrated peripheral member. Similarly to the pressure sensor 1BA according to the fourth embodiment, pressure sensors 1BB to 1BM according to later-described fifth to 16th embodiments include pressure sensors 10BB to 10BM, respectively.

<Pressure Sensor Body>

The pressure sensor body 10BA is a member that includes a functional element 40B and changes in physical property with a change in pressure. The pressure sensor body 10BA illustrated in FIG. 10 is composed of a functional element 40BA (40B) and substantially does not include any material other than the functional element 40BA. In the pressure sensor 1BC according to the later-described sixth embodiment, for example, the temperature sensor body 10B includes a base material 30B, which is made of a material other than that of the functional element 40B.

(Functional Element)

The functional element 40B is an element that includes a composition of trititanium pentoxide ($Ti_3O_5$) and changes in physical property with a change in pressure when the functional element 40B is pressurized at 1 MPa or higher. Such a change in physical property normally occurs when the functional element 40B is at lower than 190° C.

The functional element 40B is an element composed of the functional titanium oxide. In other words, the functional titanium oxide is the material of the functional element 40B. Herein, the functional titanium oxide refers to a substance that includes a composition of trititanium pentoxide and changes in physical property with a change in pressure when the functional titanium oxide is pressurized at 1 MPa or higher.

The functional titanium oxide is a substance that includes crystal grains of at least λ-phase trititanium pentoxide when the functional titanium oxide is not pressurized; and has the property that at least a portion of crystal grains of λ-phase trititanium pentoxide change into crystal grains of β-phase trititanium pentoxide when the functional titanium oxide is pressurized at 1 MPa or higher. In the functional titanium oxide, at least a portion of crystal grains of λ-phase trititanium pentoxide normally change into crystal grains of β-phase trititanium pentoxide even if the functional titanium oxide not pressurized is pressurized at a pressure of lower than 1 MPa. However, when the functional titanium oxide is pressurized at 1 MPa or higher, crystal grains of λ-phase trititanium pentoxide are more likely to change into crystal grains of β-phase trititanium pentoxide. The aforementioned property that at least a portion of crystal grains of λ-phase trititanium pentoxide change into crystal grains of β-phase trititanium pentoxide when the functional titanium oxide is pressurized at 1 MPa or higher is developed at lower than 190° C. When the functional titanium oxide is higher than 190° C., at least a portion of crystal grains of trititanium pentoxide undergo phase transition into crystal grains of α-phase trititanium pentoxide, making it less likely to cause the phase transition from the λ-phase trititanium pentoxide to β-phase trititanium pentoxide.

The physical property of the functional element 40B and the functional titanium oxide as the material thereof that changes with a change in pressure is one or more selected from electric conductivity, color, and magnetic properties, for example. These physical properties are described later.

The functional titanium oxide is described in terms of the relationship between the phase of the functional titanium oxide and pressure applied thereto.

(Functional Titanium Oxide)

The functional titanium oxide includes crystal grains of at least λ-phase trititanium pentoxide ($λ$-$Ti_3O_5$) at lower than 190° C. when not pressurized. The functional titanium oxide normally includes crystal grains of λ-phase trititanium pentoxide ($λ$-$Ti_3O_5$) and β-phase trititanium pentoxide ($β$-$Ti_3O_5$) at lower than 190° C. when not pressurized. The functional titanium oxide normally thus includes two phases of λ-phase trititanium pentoxide and β-phase trititanium pentoxide at lower than 190° C. when not pressurized. In the functional titanium oxide used in the embodiments, the phase ratio of λ-phase trititanium pentoxide to β-phase trititanium pentoxide is not particularly limited.

The functional titanium oxide includes the property that at least a portion of crystal grains of λ-phase trititanium pentoxide change into crystal grains of β-phase trititanium pentoxide at lower than 190° C. when pressurized at 1 MPa or higher. The functional titanium oxide has the property that at least a portion of crystal grains of λ-phase trititanium pentoxide undergo phase transition into crystal grains of β-phase trititanium pentoxide at lower than 190° C. when pressurized at 1 MPa or higher.

In addition, the functional titanium oxide has the property of increasing in ratio of crystal grains of λ-phase trititanium pentoxide that undergo phase transition into β-phase trititanium pentoxide, with an increase in the applied pressure at lower than 190° C. The functional titanium oxide has the property of increasing the phase transition from λ-phase trititanium pentoxide into β-phase trititanium pentoxide with the applied pressure at lower than 190° C.

As described above, at lower than 190° C., the functional titanium oxide includes the property that the phase ratio of λ-phase trititanium pentoxide decreases with increasing of the pressure applied thereto while the phase ratio of β-phase trititanium pentoxide increases. For example, it is assumed that the functional titanium oxide includes X mol % crystal grains of λ-phase trititanium pentoxide and (100–X) mol % crystal grains of β-phase trititanium pentoxide at lower than 190° C. when not pressurized. Such a functional titanium oxide includes the property of decreasing in value of X when pressurized at 1 MPa or higher.

The characteristic of the functional titanium oxide that the phase ratio of λ-phase trititanium pentoxide decreases with increasing of the applied pressure while the phase ratio of β-phase trititanium pentoxide increases varies from one functional titanium oxide to another. This characteristic is referred to as a "phase ratio characteristic" hereinafter. The phase ratio characteristic is considered to be determined by the phase ratio of λ-phase to β-phase in the functional titanium oxide not pressurized, the size of crystal grains, or the like. If the phase ratio characteristic of the functional titanium oxide is measured in advance, the pressure applied to the functional titanium oxide can be measured by measuring the phase ratio of λ- or β-phase trititanium pentoxide in the functional titanium oxide after pressurization.

Once the crystalline structure of crystal grains of the functional titanium oxide undergoes phase transition between λ-phase trititanium pentoxide and β-phase trititanium pentoxide with a change in pressure, the functional titanium oxide has the property of maintaining the crystalline structure after the phase transition at lower than 190° C. By applying the phase ratio characteristic measured in advance to the phase ratio of λ-phase or β-phase trititanium pentoxide in the functional titanium oxide after pressurization, the peak pressure applied to the functional titanium oxide can be calculated.

The phase ratio characteristic is described in detail below. The phase ratios of λ-phase trititanium pentoxide and β-phase trititanium pentoxide in the functional titanium oxide are usually represented as follows when the total of the phase ratios of λ-phase trititanium pentoxide and β-phase trititanium pentoxide is 100 mol %. In a coordinate system showing the phase ratio (mol %) of λ-phase trititanium pentoxide on the vertical axis and pressure applied to the functional titanium oxide on the horizontal axis, the phase ratio of λ-phase trititanium pentoxide in the functional titanium oxide at lower than 190° C. exhibits a monotonically decreasing curve (λ-phase ratio curve $C_\lambda$). In the same coordinate system, the phase ratio of β-phase trititanium pentoxide in the functional titanium oxide at lower than 190° C. exhibits a monotonically increasing curve (β-phase ratio curve $C_\beta$).

By applying the λ-phase ratio curve $C_\lambda$ or β-phase ratio curve $C_\beta$, which are measured in advance, to the λ-phase or β-phase ratio in the functional titanium oxide after pressurization, the peak value of the pressure applied to the functional titanium oxide is calculated. The λ-phase ratio curve $C_\lambda$ or β-phase ratio curve $C_\beta$ included in the phase ratio characteristic are considered to be determined by the phase ratio of λ-phase to β-phase in the functional titanium oxide not pressurized, the size of crystal grains thereof, or the like.

The λ-phase ratio curve Ca and β-phase ratio curve $C_\beta$ intersect in some cases depending on the phase ratio of λ-phase to β-phase in the functional titanium oxide not pressurized, the size of crystal grains thereof, or the like. The λ-phase ratio curve $C_\lambda$ and β-phase ratio curve $C_\beta$ intersect when the phase ratio ($R_{\lambda 0}$) at an applied pressure of 0 in the λ-phase ratio curve C is greater than the phase ratio ($R_{\beta 0}$) at an applied pressure of 0 in the β-phase ratio curve $C_\beta$. In the functional titanium oxide of such a characteristic, the λ-phase ratio and β-phase ratio are reversed at a pressure of the intersection ($P_{INT}$) of the λ-phase ratio curve C and β-phase ratio curve $C_\beta$. Specifically, the λ-phase ratio is greater than the β-phase ratio in a pressure region lower than the pressure at the intersection $P_{INT}$ while the λ-phase ratio is less than the β-phase ratio in a pressure region higher than the pressure at the intersection $P_{INT}$. By using the functional titanium oxide of such a characteristic, the reverse of the λ-phase ratio and β-phase ratio facilitates detection of a change in pressure.

For the functional titanium oxide of the fourth embodiment, the intersection $P_{INT}$ can be adjusted to any pressure value by controlling the phase ratios of the λ-phase trititanium pentoxide and β-phase trititanium pentoxide or the sizes of crystal grains thereof. The functional titanium oxide can be prepared so that the phase ratio of λ-phase trititanium pentoxide is greater than that of β-phase trititanium pentoxide when pressurized at a predetermined pressure at lower than 190° C., for example. With such a functional titanium oxide, it is easy to detect that the peak applied pressure is equal to or higher than the intersection $P_{INT}$ by measuring the phase ratios of λ-phase trititanium pentoxide and β-phase trititanium pentoxide.

β-phase trititanium pentoxide and λ-phase trititanium pentoxide, which constitute the functional titanium oxide, are different in physical properties. For example, β-phase trititanium pentoxide and λ-phase trititanium pentoxide are different in electric conductivity. Specifically, β-phase trititanium pentoxide has an electric conductivity in the same range as that of many semiconductors while the λ-phase trititanium pentoxide has an electric conductivity in the same range as that of many metals. By measuring the electric conductivity of the functional titanium oxide with a publicly-known electric conductivity measurement apparatus, the peak value of pressure applied to the functional titanium oxide is calculated. Changes in electric conductivity of the functional titanium oxide are known by measuring electric resistance between two or more electrodes across the functional titanium oxide, for example.

β-phase trititanium pentoxide and λ-phase trititanium pentoxide are different in color. Specifically, β-phase trititanium pentoxide is red or brownish red, and λ-phase trititanium pentoxide is blue. The peak value of pressure applied to the functional titanium oxide can be calculated by visually observing the color of the functional titanium oxide or evaluating the same based on the adsorption spectrum to calculate the λ-phase or β-phase ratio of the functional titanium oxide.

β-phase trititanium pentoxide and λ-phase trititanium pentoxide are different in magnetic property. Specifically, β-phase trititanium pentoxide is non-magnetic, and λ-phase trititanium pentoxide is paramagnetic. The peak value of pressure applied to the functional titanium oxide can be calculated by measuring the difference in magnetic property of the functional titanium oxide with a publicly-known magnetization evaluation apparatus.

The aforementioned specific property of the functional titanium oxide is developed when the average grain size (median size) of crystal grains of the functional titanium oxide is within a specific range. The average grain size (median size) of crystal grains of the functional titanium oxide is normally 1 to 1000 nm, preferably 5 to 50 nm, and more preferably 10 to 20 nm. Herein, the average grain size of crystal grains of the functional titanium oxide refers to the average grain size of crystal grains of β-phase trititanium pentoxide and λ-phase trititanium pentoxide constituting the functional titanium oxide. On the other hand, when the average grain size of crystal grains of the functional titanium oxide is out of the aforementioned range, the physical properties is likely not to change with a change in pressure. For example, bulk trititanium pentoxide normally do not change in physical property with a change in pressure.

The minimum unit functioning as the functional titanium oxide is crystal grains of trititanium pentoxide having an average grain size within the aforementioned range. As the minimum unit functioning as the functional titanium oxide, nanoparticles of monocrystal crystal grains having an average grain size within the aforementioned range can be used. However, nanoparticles having an average grain size within the aforementioned range are difficult to handle, and the functional titanium oxide is normally polycrystal of crystal grains of trititanium pentoxide having an average grain size within the aforementioned range. The shape of this polycrystal of crystal grains is not particularly limited and is granular, for example.

The granular polycrystal of crystal grains has an average grain size (median size) of typically 50 nm to 500 μm, preferably 1 to 50 μm, and more preferably 3 to 8 μm. Granular polycrystal of crystal grains having an average grain size (median size) in the aforementioned range is easy to handle.

The granular polycrystal of crystal grains can be used directly and also can be formed into a compact of polycrystal of crystal grains, such as a pellet obtained by compressing a number of grains of polycrystal of crystal grains, or can be contained in the base material 30B. The compact may be shaped without using a mold or may be a molded body produced by using a mold. The functional element 40BA of the pressure sensor body 10BA of the pressure sensor 1BA according to the fourth embodiment is a compact made of the functional titanium oxide. Specifically, the functional element 40BA is a pellet obtained by compressing polycrystal of crystal grains of the functional titanium oxide.

As described above, the functional element 40B and the functional titanium oxide as the material thereof undergo phase transition of the crystalline structure of crystal grains between the λ-phase trititanium pentoxide and β-phase trititanium pentoxide with a change in pressure to change in physical property. The functional element 40B and the functional titanium oxide as the material thereof also change in physical property with a change in temperature due to phase transition of the crystalline structure of crystal grains between the λ-phase trititanium pentoxide and β-phase trititanium pentoxide or changes in composition of crystal grains into a composition other than trititanium pentoxide. Once the functional titanium oxide undergoes phase transition of the crystalline structure of crystal grains between the λ-phase trititanium pentoxide and β-phase trititanium pentoxide or changes in composition of crystal grains with a change in temperature, the functional titanium oxide includes the property of maintaining the crystalline state after the phase transition or the change in composition if the applied pressure does not change substantially.

Hereinafter, a description is given of changes in physical properties with changes in temperature. The functional titanium oxide changes in physical property due to influences of changes in pressure and temperature. The following description is given of changes in physical property of the functional titanium oxide with a change in temperature at normal pressure.

The functional titanium oxide includes crystal grains of β-phase trititanium pentoxide and crystal grains of λ-phase trititanium pentoxide at lower than 350° C. and normal pressure.

The functional titanium oxide includes the characteristic that at least a portion of crystal grains of β-phase trititanium pentoxide normally undergo phase transition into crystal grains of λ-phase trititanium pentoxide when heated to a temperature of not lower than 190° C. and lower than 350° C. Even in the functional titanium oxide with the phase ratio of λ-phase trititanium pentoxide once reduced with a change in pressure, the ratio of λ-phase trititanium pentoxide can be increased again by heating the functional titanium oxide to a temperature of not lower than 190° C. and lower than 350° C. The functional titanium oxide can be reused as the substance to detect a change in pressure after heated to a temperature of not lower than 190° C. and lower than 350° C.

The functional titanium oxide includes the property that at least a portion of crystal grains of λ-phase and β-phase trititanium pentoxide change into crystal grains of titanium dioxide ($TiO_2$) when the functional titanium oxide is heated to 350° C. or higher at normal pressure. Specifically, when the functional titanium oxide is heated to 350° C. or higher, 5 mol % or more of crystal grains of λ-phase trititanium pentoxide change in composition into crystal grains of titanium dioxide. The functional titanium oxide therefore includes crystal grains of β-phase trititanium pentoxide, crystal grains of λ-phase trititanium pentoxide, and crystal grains of titanium dioxide at 350° C. or higher and normal pressure. Herein, titanium dioxide ($TiO_2$) is an idea including rutile, anatase, and brookite.

Titanium dioxide is different in physical properties from β-phase trititanium pentoxide and λ-phase trititanium pentoxide which constitute the functional titanium oxide. For example, titanium dioxide, β-phase trititanium pentoxide and λ-phase trititanium pentoxide are different in electric conductivity respectively. Specifically, titanium dioxide has an electric conductivity in the same range as that of many insulators. On the other hand, β-phase trititanium pentoxide has an electric conductivity in the same range as that of many semiconductors while the λ-phase trititanium pentoxide has an electric conductivity in the same range as that of many metals. By measuring the difference in electric conductivity of the functional titanium oxide which has been heated to 350° C. or higher with a publicly-known electric conductivity measurement apparatus, the presence of titanium dioxide in the functional titanium oxide can be confirmed.

Titanium dioxide, β-phase trititanium pentoxide, and λ-phase trititanium pentoxide are different in color. Specifically, titanium dioxide, β-phase trititanium pentoxide, and λ-phase trititanium pentoxide are different in color, which are white, red or brownish red, and blue, respectively. By visually observing the color of the functional titanium oxide which has been heated to 350° C. or higher or evaluating the same based on the adsorption spectrum, the presence of titanium dioxide in the functional titanium oxide can be confirmed.

Titanium dioxide, β-phase trititanium pentoxide, and λ-phase trititanium pentoxide are different in magnetic property. By measuring the difference in magnetic property in the functional titanium oxide which has been heated to 350° C. or higher with a publicly-known magnetization evaluation apparatus, the presence of titanium dioxide, β-phase trititanium pentoxide, and λ-phase trititanium pentoxide in the functional titanium oxide can be confirmed.

<Operation of Pressure Sensor>

The pressure sensor 1BA exerts the operation of detecting pressures based on a change in physical property of the functional titanium oxide as the material of the functional element 40 constituting the pressure sensor body 10BA, with a change in pressure when the functional titanium oxide is pressurized at 1 MPa or higher.

The pressure sensor 1BA is used in a temperature range where the temperature of the pressure sensor body 10BA is lower than 190° C. This is because, if the temperature of the pressure sensor body 10BA is higher than 190° C., the physical properties of the functional titanium oxide as the material of the functional element 40B do not change with a change in pressure. Once changing in the physical property with a change in pressure, the pressure sensor body 10BA of the pressure sensor 1BA maintains the physical properties having changed even after the applied pressure is removed. The following description is given of the operation in the case where the pressure sensor 1BA not pressurized is used in a temperature range that the temperature of the pressure sensor body 10BA is lower than 190° C.

In the pressure sensor 1BA, when a pressure of 1 MPa or higher is applied to the pressure sensor body 10BA at lower than 190° C., at least a portion of crystal grains of λ-phase trititanium pentoxide of the functional element 40B composed of the functional titanium oxide change into crystal grains of β-phase trititanium pentoxide.

In the functional element 40B composed of the functional titanium oxide, the proportion of the crystal grains of λ-phase trititanium pentoxide that undergo phase transition into crystal grains of β-phase trititanium pentoxide increases with increasing of the pressure applied thereto at lower than 190° C. In other words, the functional element 40B composed of the functional titanium oxide has the property that the phase ratio of λ-phase trititanium pentoxide decreases with increasing of the pressure applied thereto at lower than 190° C. while the phase ratio of β-phase trititanium pentoxide increases. The characteristic (phase ratio characteristic) of the functional titanium oxide that the phase ratio of λ-phase trititanium pentoxide decreases with the pressure applied thereto at lower than 190° C. while the phase ratio of β-phase trititanium pentoxide increases varies from one functional titanium oxide to another.

Measurement of the phase ratio characteristic in advance for the functional element 40B constituting the pressure sensor body 10BA allows for measurement of the peak value of pressure applied to the pressure sensor body 10BA. Specifically, when the phase ratio characteristic of the functional element 40B is measured in advance, the peak value of the pressure applied to the functional element 40B is measured by measuring the phase ratio of λ- or β-phase trititanium pentoxide in the functional element 40B after pressurization. According to the pressure sensor 1BA, it is therefore possible to measure the peak value of pressure applied to the pressure sensor body 10BA.

The function of the functional element 40B composed of the functional titanium oxide that changes in physical property with a change in pressure is based on the characteristic of the functional titanium oxide of itself. This eliminates the need for facilities such as a power supply that supplies energy to the pressure sensor 1BA. In addition, the phase ratio of λ-phase trititanium pentoxide can be increased again by heating the functional element 40B composed of the functional titanium oxide to a temperature of not lower than 190° C. and lower than 350° C. The pressure sensor 1BA can be therefore reused as the substance to detect a change in pressure by heat treatment of the pressure sensor body 10BA to a temperature of not lower than 190° C. and lower than 350° C.

<Effect of Pressure Sensor>

The pressure sensor 1BA is therefore used repeatedly and does not need a power supply. In addition, the characteristic of the functional titanium oxide, which is the material of the functional element 40B constituting the pressure sensor body 10BA, changing in physical property with a change in pressure is not influenced by the ambient atmosphere. The pressure sensor 1BA can be therefore used in an atmosphere, such as air, oxygen atmosphere, or nitrogen atmosphere.

Fifth Embodiment

Figure 11:
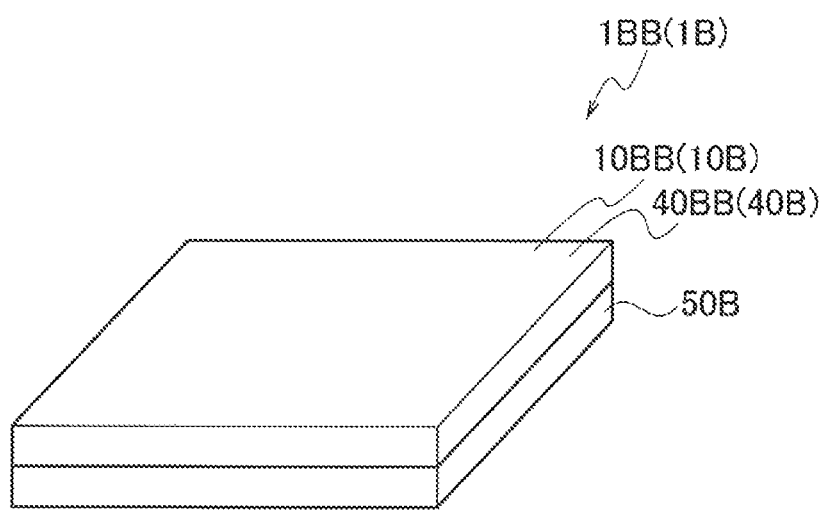
FIG. 11 is a schematic perspective view illustrating a pressure sensor according to a fifth embodiment.

FIG. 11 is a schematic perspective view illustrating a pressure sensor according to a fifth embodiment. A pressure sensor 1BB (1B) (illustrated in FIG. 11) includes a pressure sensor body 10BB (10B). The pressure sensor body 10BB is composed of a functional element 40BB (40B), which is a thin film 40BB made of the functional titanium oxide. The thin film 40BB is formed on a substrate 50B. In other words, the pressure sensor 1BB includes the substrate 50B and the thin film 40BB as the functional element formed on the substrate 50B.

The pressure sensor 1BB according to the fifth embodiment, (illustrated in FIG. 11) is the same as the pressure sensor 1BA according to the fourth embodiment (illustrated in FIG. 10) excepting the shape of the pressure sensor body 10BB and the provision of the substrate 50B. The same members of the pressure sensor 1BB according to the fifth embodiment (illustrated in FIG. 11) as the members of the pressure sensor 1BA according to the fourth embodiment (illustrated in FIG. 10) are given the same reference symbols, and the description of the configurations and operations thereof is omitted or simplified.

<Pressure Sensor Body>

A pressure sensor body 10BB is composed of the functional element 40BB (40B) and does not include substantially any material other than the functional element 40BB, similarly to the pressure sensor body 10BA of the pressure sensor 1BA according to the fourth embodiment (illustrated in FIG. 10). The functional element 40BB is made of the functional titanium oxide which is the same material as that of the functional element 40BA of the pressure sensor 1BA according to the fourth embodiment (illustrated in FIG. 10). The functional element 40BB is formed on the substrate 50B.

The functional element 40BB is a thin film of the functional titanium oxide unlike the functional element 40BA (illustrated in FIG. 10). According to the thin-film functional element 40BB, the thin film improves visibility and facilitates visual evaluation while facilitating evaluation of the absorption spectrum. The thin-film functional element 40BB is formed on the substrate 50B by using spin coating, dip coating, sputtering, CVD, laser ablation, aerosol deposition, or the like, for example.

The material of the substrate 50B is not limited particularly. Examples of the material of the substrate 50B are glass, semiconductors such as Si, SiC, and GaN, inorganic oxides such as sapphire, metals such as Al, Cu, Ti, Ni, Sn, Au, Ag, and SUS, and resins such as polyimide resin.

(Operation of Pressure Sensor)

The operations of the pressure sensor 1BB are the same as those of the pressure sensor body 1BA according to the fourth embodiment (illustrated in FIG. 10), and the description thereof is omitted.

The pressure sensor 1BB includes the substrate 50B. The pressure sensor 1BB has high mechanical strength. The pressure transmission, thermal conduction, electric conduction, and the like of the pressure sensor 1BB can be adjusted by controlling the pressure transmission, thermal conduction, electric conduction, and the like of the substrate 50B.

(Effect of Pressure Sensor)

The pressure sensor 1BB exerts the same effects as those of the pressure sensor 1BA according to the fourth embodiment (illustrated in FIG. 10).

According to the pressure sensor 1BB, the functional element 40BB is composed of a thin film, so that the visibility of the pressure sensor 1BB is higher than that of the pressure sensor 1BA.

In addition, the pressure sensor 1BB includes the substrate 50B. The pressure sensor 1BB therefore has high mechanical strength. According to the pressure sensor 1BB, the pressure transmission, thermal conduction, electric conduction, and the like thereof can be adjusted by controlling the pressure transmission, thermal conduction, electric conduction, and the like of the substrate 50B.

Sixth Embodiment

Figure 12A:
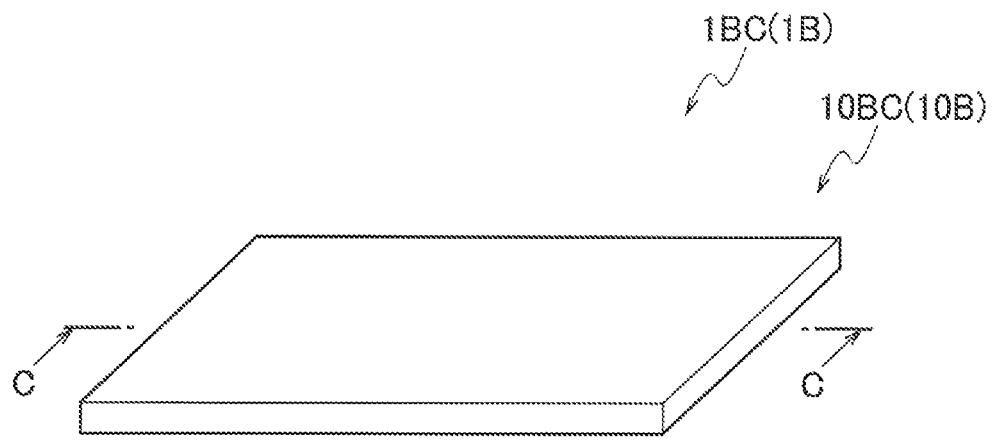
FIG. 12A is a schematic perspective view illustrating a pressure sensor according to a sixth embodiment.
Figure 12B:
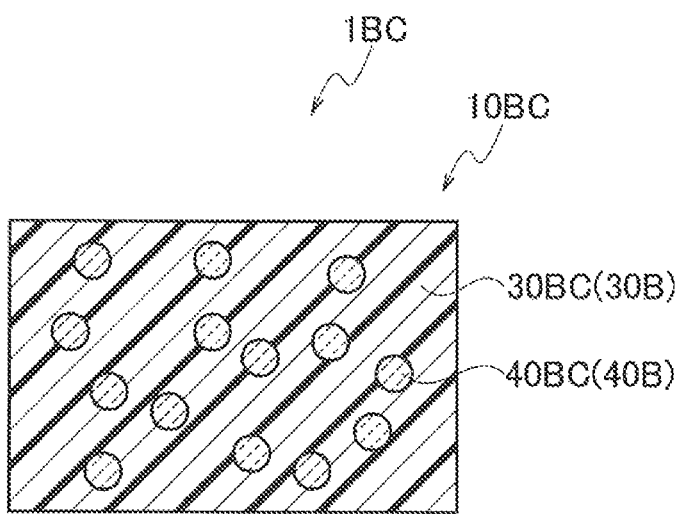
FIG. 12B is a schematic cross-sectional view along a line C-C of FIG. 12A.

FIG. 12A is a schematic perspective view illustrating a pressure sensor according to a sixth embodiment. FIG. 12B is a schematic cross-sectional view along a line C-C of FIG. 12A. A pressure sensor 1BC (1B) (illustrated in FIG. 12) includes a pressure sensor body 10BC (10B). The pressure sensor body 10BC includes a base material 30BC (30B) and a functional element 40BC (40B) included in the base material 30BC.

The pressure sensor 1BC according to the sixth embodiment (illustrated in FIGS. 12A and 12B) is the same as the pressure sensor 1BA according to the fourth embodiment (illustrated in FIG. 10) excepting the configuration of the pressure sensor body 10BC. The same members of the pressure sensor 1BC according to the sixth embodiment (illustrated in FIGS. 12A and 12B) as those of the pressure sensor 1BC according to the fourth embodiment (illustrated in FIG. 10) are given the same reference symbols, and the description of the configurations and operations thereof is omitted or simplified.

(Pressure Sensor Body)

The pressure sensor body 10BC includes the base material 30BC and the functional element 40BC contained in the base material 30BC. The base material 30BC (illustrated in FIGS. 12A and 12B) has a plate shape, but the shape thereof is not limited particularly.

In the pressure sensor body 10BC, the functional element 40BC is particles 40BC made of the functional titanium oxide. The particles 40BC made of the functional titanium oxide are granular polycrystal of crystal grains of the functional titanium oxide. The average particle size (median size) of the particles 40BC made of the functional titanium oxide is typically 100 nm to 500 μm, preferably 1 to 50 μm, and more preferably 3 to 8 μm, for example. The granular polycrystal with an average particle size (median size) in the aforementioned ranges is easy to handle.

In the pressure sensor body 10BC, the base material 30BC is used to fix the particles 40BC made of the functional titanium oxide. Specifically, the base material 30BC is made of resin. Examples of the resin used for the base material 30BC include heat-resistant resin such as polyimide, for example. When the base material 30BC is made of heat-resistant resin, the pressure sensor 1BC can be used at high temperatures because of the high heat resistance thereof. The resin constituting the base material 30BC may be hardened resin which is completely hardened or may be gel resin.

As illustrated in FIG. 12B, in the pressure sensor body 10BC, the particles 40BC made of the functional titanium oxide are dispersed in the base material 30BC. The pressure sensor body 10BC is obtained by adding the particles 40BC made of the functional titanium oxide to the base material 30BC which is fluid, followed by mixing and shape forming, for example.

(Operation of Pressure Sensor)

The operations of the pressure sensor 1BC are the same as those of the pressure sensor 1BA (illustrated in FIG. 10), excepting that the operation of the functional element 40B as the element that changes in physical property with a change in pressure is exerted in the granular functional element 40BC and the operation based on the base material 30BC is exerted. The description of the operations of the pressure sensor 1BC is omitted.

A brief description is given of the matter that the operation of the functional element 40B as the element that changes in physical property with a change in pressure is exerted in the granular functional element 40BC. The granular functional element 40BC changes in physical property with a change in pressure in a similar manner to the functional element 40BA of the pressure sensor 1BA according to the fourth embodiment (illustrated in FIG. 10). The functional element 40BC, which is substantially contained in the base material 30BC, is pressurized indirectly through the base material 30BC. The operations of the pressure sensor 1BC are the same as those of the pressure sensor 1BA according to the fourth embodiment (illustrated in FIG. 10) excepting the operation of being pressurized indirectly through the base material 30BC.

When the physical property that changes with a change in pressure is color, changes in color of the functional element 40BC are observed or measured through the base material 30BC. When the physical property that changes with a change in pressure is electric conductivity, changes in electric conductivity are measured through the base material 30BC.

(Effect of Pressure Sensor)

The pressure sensor 1BC exerts the same effects as those of the pressure sensor 1BA according to the fourth embodiment (illustrated in FIG. 10).

The pressure sensor 1BC includes the base material 30BC made of resin. The pressure sensor 1BC therefore has high mechanical strength. According to the pressure sensor 1BC, the thermal conduction, electric conduction, and the like of the pressure sensor 1BC can be adjusted by controlling the thermal conduction, electric conduction, and the like of the base material 30BC. The thermal conduction, electric conduction, and the like of the base material 30BC are adjusted by controlling the material of the resin of the base material 30BC, the amount of the base material 30BC relative to the functional element 40BC, or the like.

Furthermore, the pressure sensor 1BC includes the base material 30BC made of resin which is fluid at least in the process of manufacturing. This facilitates forming the pressure sensor 1BC into any shape.

Seventh Embodiment

Figure 13A:
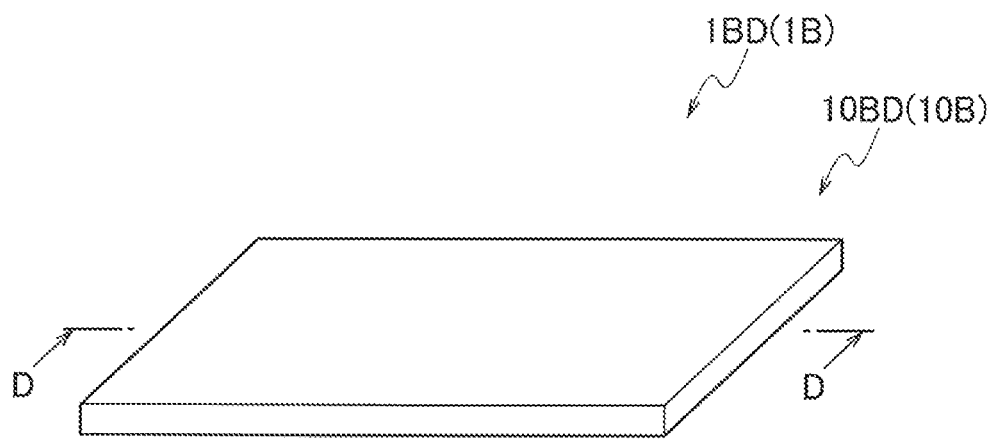
FIG. 13A is a schematic perspective view illustrating a pressure sensor according to a seventh embodiment.
Figure 13B:
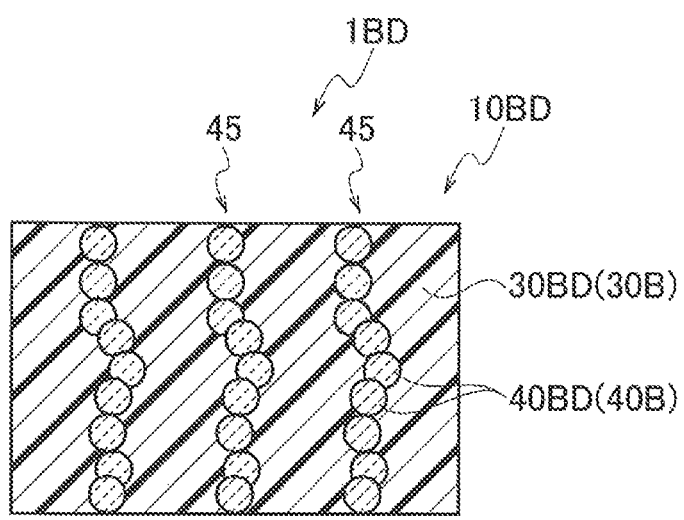
FIG. 13B is a schematic cross-sectional view along a line D-D of FIG. 13A.

FIG. 13A is a schematic perspective view illustrating a pressure sensor according to a seventh embodiment. FIG. 13B is a schematic cross-sectional view along a line D-D of FIG. 13A. A pressure sensor 1BD (1B) (illustrated in FIGS. 13A and 13B) includes a pressure sensor body 10BD (10B). The pressure sensor body 10BD includes a base material 30BD (30B) and a functional element 40BD (40B) contained in the base material 30BD.

The pressure sensor 1BD according to the seventh embodiment (illustrated in FIGS. 13A and 13B) is the same as the pressure sensor 1BC according to the sixth embodiment (illustrated in FIGS. 12A and 12B) excepting the configuration of the pressure sensor body 10BD. The same members of the pressure sensor 1BD according to the seventh embodiment (illustrated in FIGS. 13A and 13B) as those of the pressure sensor 1BC according to the sixth embodiment (illustrated in FIGS. 12A and 12B) are given the same reference symbols, and the description of the configurations and operations thereof is omitted or simplified.

(Pressure Sensor Body)

The pressure sensor body 10BD includes the base material 30BD and the functional element 40BD contained in the base material 30BD. The base material 30BD (illustrated in FIG. 13A) has a plate shape, but the shape thereof is not limited particularly.

The base material 30BD is the same resin as that of the base material 30BC used in the pressure sensor 1BC according to the sixth embodiment (illustrated in FIGS. 12A and 12B).

In the pressure sensor body 10BD, the functional element 40BD is particles 40BD made of the functional titanium oxide in a similar manner to the functional element 40BC used in the pressure sensor 1BC according to the sixth embodiment (illustrated in FIGS. 12A and 12B). The particles 40BD made of the functional titanium oxide may be the same as the particles 40BC, which are made of the functional titanium oxide and are used in the pressure sensor 1BC according to the sixth embodiment.

As illustrated in FIG. 13B, in the pressure sensor body 10BD, the particles 40BD made of the functional titanium oxide are interconnected in groups to form functional titanium oxide-particle connected bodies 45. In the pressure sensor body 10BD, the particles 40BD made of the functional titanium oxide are contained in the base material 30BD in such a manner that the particles 40BD are interconnected in groups. The number of particles 40BD interconnected in each functional titanium oxide-particle connected body 45 is any value not less than two. In the example of FIG. 13B, the number of particles 40BD interconnected in each functional titanium oxide-particle connected body 45 is nine.

As illustrated in FIG. 13B, the longitudinal direction of the functional titanium oxide-particle connected bodies 45 is vertical to the front and back surfaces of the pressure sensor body 10BD. The functional titanium oxide-particle connected bodies 45 are preferably arranged in such a manner to improve the pressure transmission, thermal conduction and electric conduction in the vertical direction to the front and back surfaces of the pressure sensor body 10BD, improving the precision of pressure measurement and facilitating the heat treatment for reuse. In each functional titanium oxide-particle connected body 45, two or more particles 40BD made of the functional titanium oxide, which provides higher pressure transmission, higher thermal conduction, and higher electric conduction than those of the resin constituting the base material 30BD, are interconnected. In the pressure sensor body 10BD, the pressure transmission, thermal conduction and electric conduction are high between the particles 40BD.

The functional titanium oxide-particle connected bodies 45 may be arranged so that the longitudinal direction of the functional titanium oxide-particle connected bodies 45 corresponds to the direction perpendicular to the vertical direction to the front and back surfaces of the pressure sensor body 10BD (not illustrated). The direction perpendicular to the vertical direction to the front and back surfaces of the pressure sensor body 10BD is the horizontal direction in FIG. 13B. The functional titanium oxide-particle connected bodies 45 are preferably arranged in such a manner to improve the pressure transmission, thermal conduction, and electric conduction along the front surface of the pressure sensor body 10BD and thereby reduce variation in measurement from one location to another in the front surface of the pressure sensor body 10BD.

The pressure sensor body 10BD is obtained by injecting the functional titanium oxide-particle connected bodies 45 into the base material 30BD which is fluid, followed by shape forming, for example.

(Operation of Pressure Sensor)

The operations of the pressure sensor 1BD are the same as those of the pressure sensor 1BC according to the sixth embodiment, (illustrated in FIGS. 12A and 12B). Since the pressure sensor body 10BD includes the functional titanium oxide-particle connected bodies 45, the pressure sensor 1BD allows for more quick observation of a change in pressure in the direction vertical to the front and back surfaces thereof from the front side, compared with the pressure sensor 1BC.

(Effect of Pressure Sensor)

The pressure sensor 1BD exerts the same effects as those of the pressure sensor 1BC according to the sixth embodiment (illustrated in FIGS. 12A and 12B).

In the pressure sensor 1BD, the pressure sensor body 10BD includes the functional titanium oxide-particle connected bodies 45. According to the pressure sensor 1BD, it is therefore possible to observe a change in pressure in the direction vertical to the front and back surfaces thereof from the front side more quickly, compared with the pressure sensor 1BC.

Eighth Embodiment

Figure 14A:
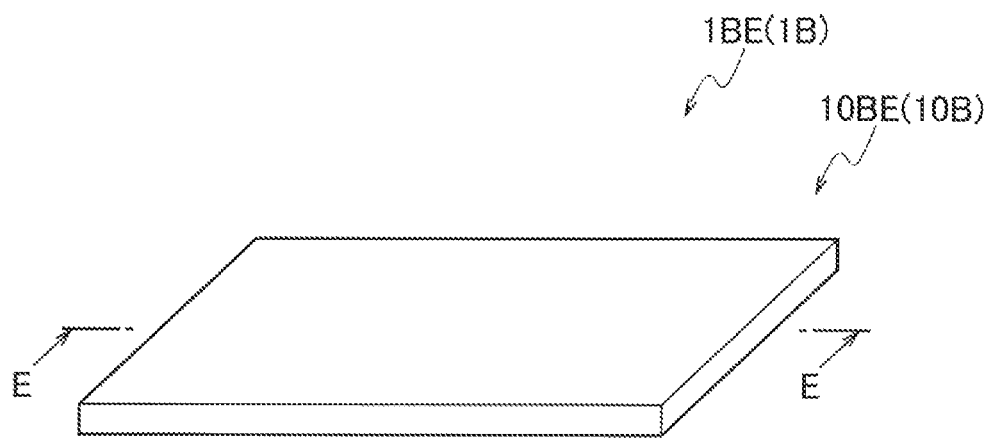
FIG. 14A is a schematic perspective view illustrating a pressure sensor according to an eighth embodiment.
Figure 14B:
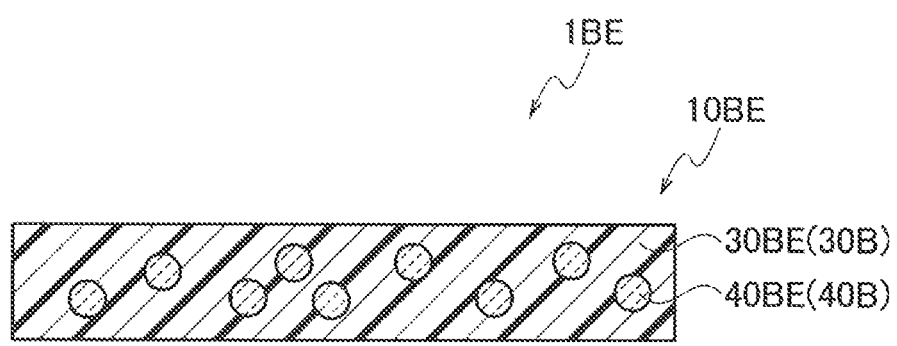
FIG. 14B is a schematic cross-sectional view along a line E-E of FIG. 14A.

FIG. 14A is a schematic perspective view illustrating a pressure sensor according to an eighth embodiment. FIG. 14B is a schematic cross-sectional view along a line E-E of FIG. 14A. A pressure sensor 1BE (1B) (illustrated in FIGS. 14A and 14B) includes a pressure sensor body 10BE (10B). The pressure sensor body 10BE includes a base material 30BE (30B) and a functional element 40BE (40B) contained in the base material 30BE.

The pressure sensor 1BE according to the eighth embodiment (illustrated in FIGS. 14A and 14B) is the same as the pressure sensor 1BC according to the sixth embodiment (illustrated in FIGS. 12A and 12B) excepting the configuration of the pressure sensor body 10BE. The same members of the pressure sensor 1BE according to the eighth embodiment (illustrated in FIGS. 14A and 14B) as those of the pressure sensor 1BC according to the sixth embodiment (illustrated in FIGS. 12A and 12B) are given the same reference symbols, and the description of the configurations and operations thereof is omitted or simplified.

(Pressure Sensor Body)

The pressure sensor body 10BE includes the base material 30BE and the functional element 40BE contained in the base material 30BE. The base material 30BE (illustrated in FIGS. 14A and 14B) has a plate shape, but the shape thereof is not limited particularly.

The base material 30BE is made of film, that is, thin film. Herein, the film refers to a thin film of a dense structure substantially not including any void. The thickness of the base material 30BE is 1 mm or less and preferably 1 µm to 1 mm, for example. When the base material 30BE is made of a soft material, such as resin, the thickness of the base material 30BE is more preferably 1 µm or greater and less than 0.2 mm. When the base material 30BE is made of a hard material, such as metal, the thickness of the base material 30BE is more preferably 1 µm or greater and less than 0.5 mm. The material of the base material 30BE is not limited particularly, and examples thereof are metals, such as Al, Cu, Ti, Ni, Sn, Au, Ag, and SUS and heat-resistance resins such as polyimide. When the base material 30BE is made of such a material, the pressure sensor 1BE can be used at high temperatures because of the high heat resistance thereof.

As illustrated in FIG. 14B, in the pressure sensor body 10BE, the particles 40BE made of the functional titanium oxide are dispersed in the base material 30BE. The pressure sensor body 10BE is obtained by adding the particles 40BE made of the functional titanium oxide to the base material 30BE, which is fluid, followed by mixing and shape forming, for example.

(Operation of Pressure Sensor)

The operations of the pressure sensor 1BE are the same as those of the pressure sensor 1BC according to the sixth embodiment (illustrated in FIGS. 12A and 12B). The pressure sensor 1BE is excellent in flexibility since the pressure sensor 1BE is a film with the base material 30BE being thin. The pressure sensor 1BE is easily attached to or laid on a curved surface.

(Effect of Pressure Sensor)

The pressure sensor 1BE exerts the same effects as those of the pressure sensor 1BC according to the sixth embodiment (illustrated in FIGS. 12A and 12B).

The pressure sensor 1BE is excellent in flexibility since the pressure sensor 1BE is a film with the base material 30BE being thin. The pressure sensor 1BE is attached to or laid on a curved surface more easily than the pressure sensor 1BC.

Ninth Embodiment

Figure 15A:
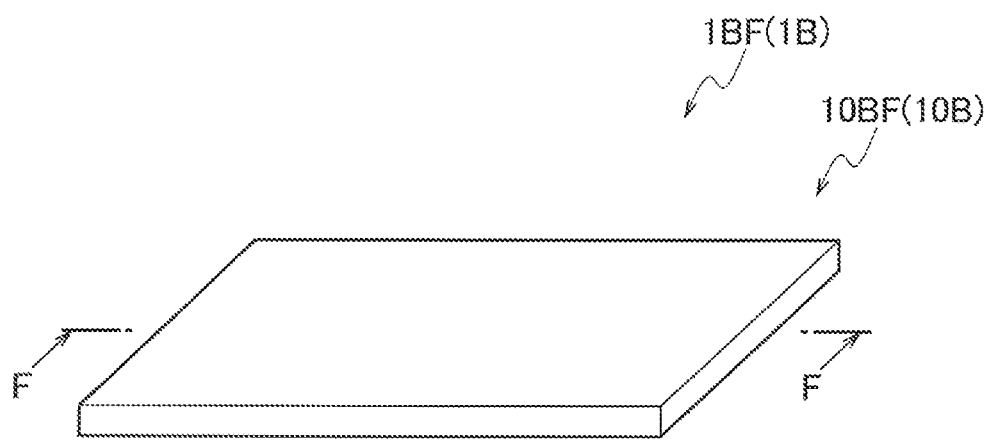
FIG. 15A is a schematic perspective view illustrating a pressure sensor according to a ninth embodiment.
Figure 15B:
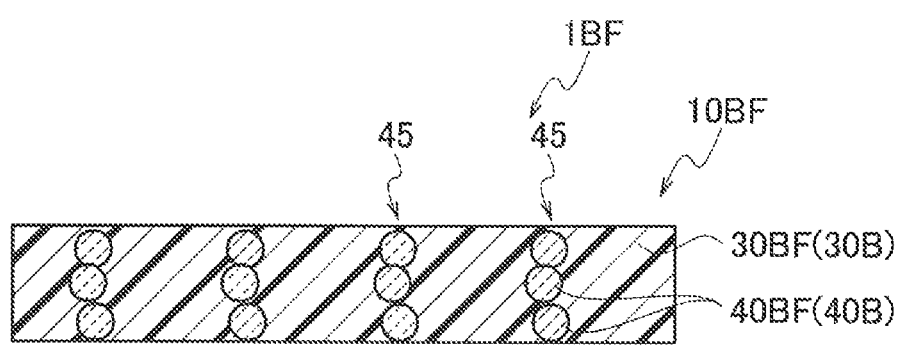
FIG. 15B is a schematic cross-sectional view along a line F-F of FIG. 15A.

FIG. 15A is a schematic perspective view illustrating a pressure sensor according to a ninth embodiment. FIG. 15B is a schematic cross-sectional view along a line F-F of FIG. 15A. A pressure sensor 1BF (1B) illustrated in FIGS. 15A and 15B includes a pressure sensor body 10BF (10B). The pressure sensor body 10BF includes a base material 30BF (30B) and a functional element 40BF (40B) contained in the base material 30BF.

The pressure sensor 1BF according to the ninth embodiment (illustrated in FIGS. 15A and 15B) is the same as the pressure sensor 1BE according to the eighth embodiment (illustrated in FIGS. 14A and 14B), excepting the configuration of the pressure sensor body 10BF. The same members of the pressure sensor 1BF according to the ninth embodiment (illustrated in FIGS. 15A and 15B) as those of the pressure sensor 1BE according to the eighth embodiment (illustrated in FIGS. 14A and 14B) are given the same reference symbols, and the description of the configurations and operations thereof is omitted or simplified.

(Pressure Sensor Body)

The pressure sensor body 10BF includes the base material 30BF and the functional element 40BF contained in the base material 30BF. The base material 30BF (illustrated in FIG. 15A) has a plate shape, but the shape thereof is not limited particularly.

The base material 30BF is composed of the same film as that of the base material 30BE used in the pressure sensor 1BE according to the eighth embodiment (illustrated in FIGS. 14A and 14B).

In the pressure sensor body 10BF, the functional element 40BF is particles 40BE made of the functional titanium oxide, in a similar manner to the functional element 40BE used in the pressure sensor 1BE according to the eighth embodiment (illustrated in FIGS. 14A and 14B). The particles 40BE made of the functional titanium oxide can be the same as the particles 40BE, which are made of the functional titanium oxide used in the pressure sensor 1BE according to the eighth embodiment.

As illustrated in FIG. 15B, in the pressure sensor body 10BF, the particles 40BF made of the functional titanium oxide are interconnected in groups to form the functional titanium oxide-particle connected bodies 45. In the pressure sensor body 10BF, the particles 40BF made of the functional titanium oxide are contained in the base material 30BF so as to be interconnected in groups. The number of particles 40BF interconnected in each functional titanium oxide-particle connected body 45 is any value not less than two. In the example of FIG. 15B, the number of particles 40BF interconnected in each functional titanium oxide-particle connected body 45 is three.

As illustrated in FIG. 15B, the longitudinal direction of the functional titanium oxide-particle connected bodies 45 is vertical to the front and back surfaces of the pressure sensor body 10BF. The functional titanium oxide-particle connected bodies 45 are preferably arranged in such a manner to improve the pressure transmission, thermal conduction, and electric conduction in the vertical direction to the front and back surfaces of the pressure sensor body 10BF, thus improving the precision of pressure measurement or facilitating the heat treatment for reuse. In each functional titanium oxide-particle connected body 45, two or more particles 40BF made of the functional titanium oxide, which provides higher pressure transmission, higher thermal conduction, and higher electric conduction than those of the resin constituting the base material 30BF, are interconnected. In the pressure sensor body 10BF, the pressure transmission, thermal conduction and electric conduction are high between the particles 40BF.

The functional titanium oxide-particle connected bodies 45 may be arranged so that the longitudinal direction of the functional titanium oxide-particle connected bodies 45 corresponds to the direction perpendicular to the vertical direction to the front and back surfaces of the temperature sensor body 10BF (not illustrated). The direction perpendicular to the vertical direction to the front and back surfaces of the temperature sensor body 10BF is the horizontal direction in FIG. 15B. The functional titanium oxide-particle connected bodies 45 are preferably arranged in such a manner to improve the pressure transmission, thermal conduction, and electric conduction along the front surface of the pressure sensor body 10BF and reduce variation in measurement from one location to another in the front surface of the pressure sensor body 10BF.

The pressure sensor body 10BF is obtained by injecting the functional titanium oxide-particle connected bodies 45 into the base material 30BF, which is fluid, followed by shape forming, for example.

(Operation of Pressure Sensor)

The operations of the pressure sensor 1BF are the same as those of the pressure sensor 1BE according to the eighth embodiment (illustrated in FIGS. 14A and 14B). Since the pressure sensor 1BF includes the functional titanium oxide-particle connected bodies 45, the pressure sensor 1BF allows for more quick observation of a change in pressure in the direction vertical to the front and back surfaces thereof, from the front side, compared with the pressure sensor 1BE.

(Effect of Pressure Sensor)

The pressure sensor 1BF exerts the same effects as those of the pressure sensor 1BE according to the eighth embodiment (illustrated in FIGS. 14A and 14B).

In the pressure sensor 1BF, the pressure sensor body 10BF includes the functional titanium oxide-particle connected bodies 45. According to the pressure sensor 1BF, it is possible to measure a change in pressure in the vertical direction to the front and back surfaces from the front side more quickly, compared with the pressure sensor BE.

10th Embodiment

Figure 16A:
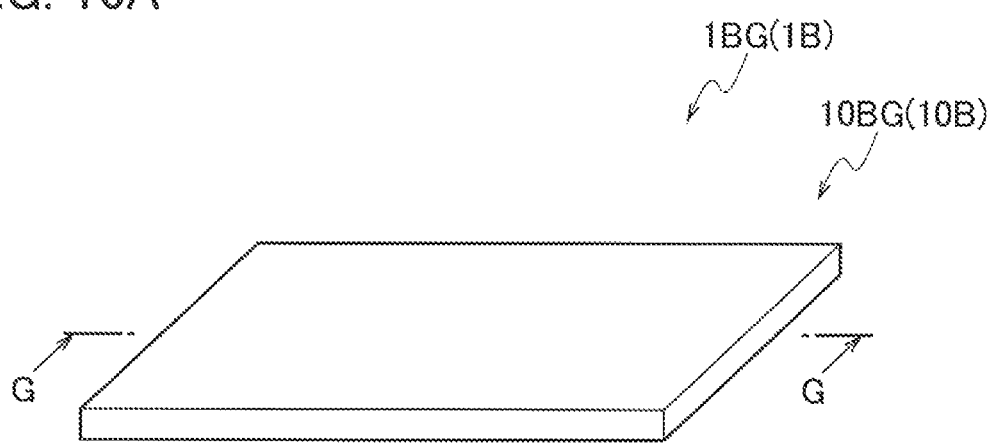
FIG. 16A is a schematic perspective view illustrating a pressure sensor according to a 10th embodiment.
Figure 16B:
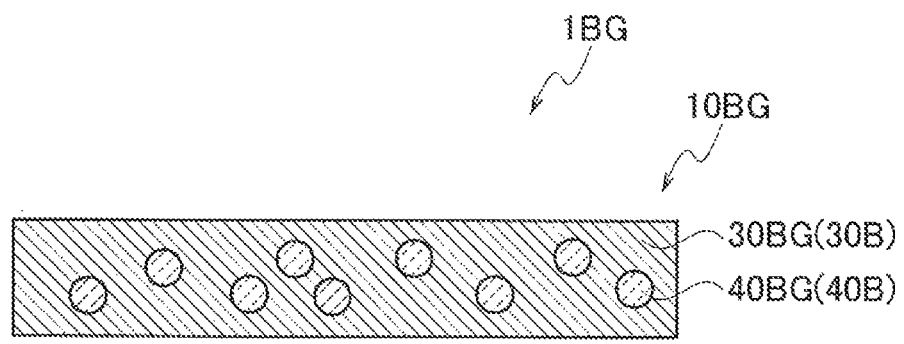
FIG. 16B is a schematic cross-sectional view along a line G-G of FIG. 16A.

FIG. 16A is a schematic perspective view illustrating a pressure sensor according to a 10th embodiment. FIG. 16B is a schematic cross-sectional view along a line G-G of FIG. 16A. A pressure sensor 1BG (1B) (illustrated in FIGS. 16A and 16B) includes a pressure sensor body 10BG (10B). The pressure sensor body 10BG includes a base material 30BG (30B) and a functional element 40BG (40B) contained in the base material 30BG.

The pressure sensor 1BG according to the 10th embodiment (illustrated in FIGS. 16A and 16B) is the same as the pressure sensor 1BC according to the sixth embodiment (illustrated in FIGS. 12A and 12B) excepting the configuration of the pressure sensor body 10BG. The same members of the pressure sensor 1BG according to the 10th embodiment (illustrated in FIGS. 16A 3 and 16B) as those of the pressure sensor 1BC according to the sixth embodiment (illustrated in FIGS. 12A and 12B) are given the same reference symbols, and the description of the configurations and operations thereof is omitted or simplified.

(Pressure Sensor Body)

The pressure sensor body 10BG includes the base material 30BG and the functional element 40BG contained in the base material 30BG.

The base material 30BG is a sheet made of woven or non-woven fabric. In this specification, sheets refer to woven or non-woven fabric. The material of the base material 30BG is not limited particularly, and examples thereof include glass fibers and carbon fibers. The base material 30BG is made of glass or carbon fiber woven fabric, glass or carbon fiber non-woven fabric, or the like, for example. When the base material 30BG is made of such a material, the pressure sensor 1BG can be used at high temperatures because of the high heat resistance thereof.

As illustrated in FIG. 16B, in the pressure sensor body 10BG, the particles 40BG made of the functional titanium oxide are dispersed in the base material 30BG. The particles 40BG made of the functional titanium oxide are dispersed in the base material 30BG in such a manner that the particles 40BG are trapped between fibers constituting the base material 30BG or fixed to the fibers constituting the base material 30BG, for example.

The pressure sensor body 10BG is obtained by immersing the base material 30BG in a solution or slurry including the particles 40BG made of functional titanium oxide and taking out the same so as to disperse and fix the particles 40BG made of the functional titanium oxide in voids between the fibers constituting the base material 30BG.

(Operation of Pressure Sensor)

The operations of the pressure sensor 1BG are the same as those of the pressure sensor 1BC according to the sixth embodiment (illustrated in FIGS. 12A and 12B). Since the base material 30BG is a sheet made of woven or non-woven fabric, the pressure sensor 1BG is excellent in flexibility. The pressure sensor 1BG is therefore easily attached to or laid on a curved surface.

(Effect of Pressure Sensor)

The pressure sensor 1BG exerts the same effects as those of the pressure sensor 1BC according to the sixth embodiment (illustrated in FIGS. 12A and 12B).

In addition, the base material 30BG is a sheet made of woven or non-woven fabric, and the pressure sensor 1BG is excellent in flexibility. The pressure sensor 1BG is therefore attached to or laid on a curved surface more easily than the pressure sensor 1BC.

11th Embodiment

Figure 17A:
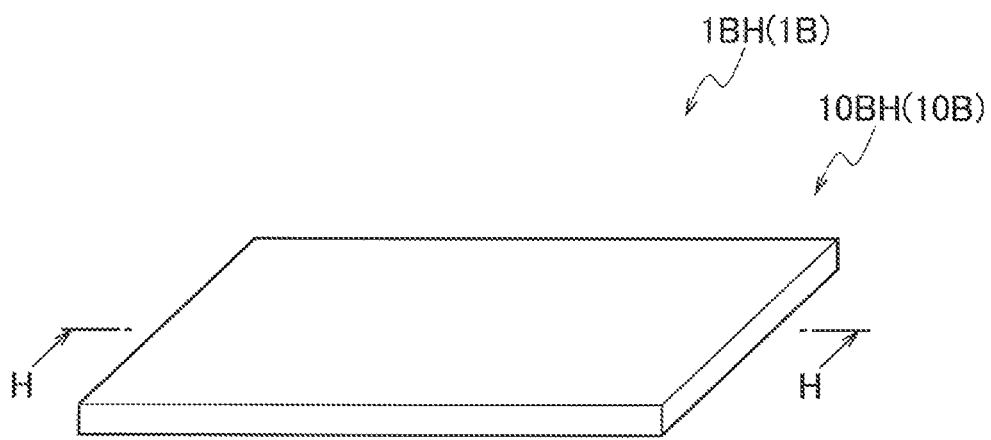
FIG. 17A is a schematic perspective view illustrating a pressure sensor according to an 11th embodiment.
Figure 17B:
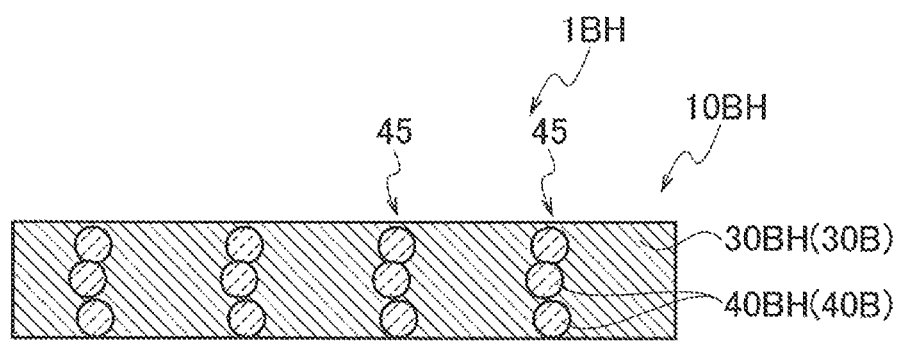
FIG. 17B is a schematic cross-sectional view along a line H-H of FIG. 17A.

FIG. 17A is a schematic perspective view illustrating a pressure sensor according to an 11th embodiment. FIG. 17B is a schematic cross-sectional view along a line H-H of FIG. 17A. A pressure sensor 1BH (1B) illustrated in FIGS. 17A and 17B includes a pressure sensor body 10BH (10B). The pressure sensor body 10BH includes a base material 30BH (30B) and a functional element 40BH (40B) contained in the base material 30BH.

The pressure sensor 1BH according to the 11th embodiment (illustrated in FIGS. 17A and 17B) is the same as the pressure sensor 1BG according to the 10th embodiment (illustrated in FIGS. 16A and 16B) excepting the configuration of the pressure sensor body 10BH. The same members of the pressure sensor 1BH according to the 11th embodiment (illustrated in FIGS. 17A and 17B) as those of the pressure sensor 1BG according to the 10th embodiment (illustrated in FIGS. 16A and 16B) are given the same reference symbols, and the description of the configurations and operations thereof is omitted or simplified.

(Pressure Sensor Body)

The pressure sensor body 10BH includes the base material 30BH and the functional element 40BH contained in the base material 30BH.

The base material 30BH is composed of the same sheet made of woven or non-woven fabric as that of the base material 30BG used in the pressure sensor 1BG according to the 10th embodiment (illustrated in FIGS. 16A and 16B).

In the pressure sensor body 10BH, the functional element 40BH is particles 40BH made of the functional titanium oxide, in a similar manner to the functional element 40BG used in the pressure sensor 1BG according to the 10th embodiment (illustrated in FIGS. 16A and 16B). The particles 40BH made of the functional titanium oxide can be the same as the particles 40BG made of the functional titanium oxide used in the pressure sensor 1BG according to the 10th embodiment.

As illustrated in FIG. 17B, in the pressure sensor body 10BH, the particles 40BH made of the functional titanium oxide are interconnected in groups to form the functional titanium oxide-particle connected bodies 45. In the pressure sensor body 10BH, the particles 40BH made of the functional titanium oxide are contained in the base material 30BH so as to be interconnected in groups. The functional titanium oxide-particle connected bodies 45 formed by interconnection of the particles 40BH made of the functional titanium oxide are distributed in the base material 30BH. The functional titanium oxide-particle connected bodies 45 are trapped between fibers constituting the base material 30BH or fixed to the fibers constituting the material 30BH to be distributed in the base material 30BH, for example.

The number of the particles 40BH interconnected in each functional titanium oxide-particle connected body 45 is not any value not less than two. In the example of FIG. 17B, the number of particles 40BH interconnected in each functional titanium oxide-particle connected body 45 is three.

As illustrated in FIG. 17B, the longitudinal direction of the functional titanium oxide-particle connected bodies 45 is vertical to the front and back surfaces of the pressure sensor body 10BH. The functional titanium oxide-particle connected bodies 45 are preferably arranged in such a manner to improve the pressure transmission, thermal conduction, and electric conduction in the vertical direction to the front and back surfaces of the pressure sensor body 10BH, improving the precision of pressure measurement and facilitating the heat treatment for reuse. In each functional titanium oxide-particle connected body 45, two or more particles 40BH made of the functional titanium oxide that provides higher pressure transmission, higher thermal conduction, and higher electric conduction than those of the resin constituting the base material 30BH are interconnected. In the pressure sensor body 10BH, the pressure transmission, thermal conduction, and electric conduction are higher between the particles 40BH.

The functional titanium oxide-particle connected bodies 45 may be arranged so that the longitudinal direction of the functional titanium oxide-particle connected bodies 45 corresponds to the perpendicular direction to the direction vertical to the front and back surfaces of the temperature sensor body 10BH (not illustrated). Herein, the perpendicular direction to the direction vertical to the front and back surfaces of the pressure sensor body 10BH is the horizontal direction in FIG. 17B. The functional titanium oxide-particle connected bodies 45 are preferably arranged in such a manner to improve the pressure transmission, thermal conduction, and electric conduction along the front surface of the pressure sensor body 10BH and reduce variation in measurement from one location to another in the front surface of the temperature sensor body 10BH.

The pressure sensor body 10BH is obtained in the following manner, for example. The base material 30BH is immersed in a solution or slurry including the functional titanium oxide-particle connected bodies 45 and then taken out so that the functional titanium oxide-particle connected bodies 45 are fixed in voids between the fibers constituting the base material 30BH.
(Operation of Pressure Sensor)

The operations of the pressure sensor 1BH are the same as those of the pressure sensor 1BG according to the 10th embodiment (illustrated in FIGS. 16A and 16B). Since the pressure sensor body 10BH includes the functional titanium oxide-particle connected bodies 45, the pressure sensor 1BH allows for more quick observation of a change in pressure in the vertical direction to the front and back surfaces, from the front side, compared with the pressure sensor 1BG.
(Effect of Pressure Sensor)

The pressure sensor 1BH exerts the same effects as those of the pressure sensor 1BG according to the 10th embodiment (illustrated in FIGS. 16A and 16B).

In the pressure sensor 1BH, the pressure sensor body 10BH includes the functional titanium oxide-particle connected bodies 45. The pressure sensor 1BH therefore allows for quick observation of a change in pressure in the vertical direction to the front and back surfaces from the front side, compared with the pressure sensor 1BG.

12th Embodiment

Figure 18:
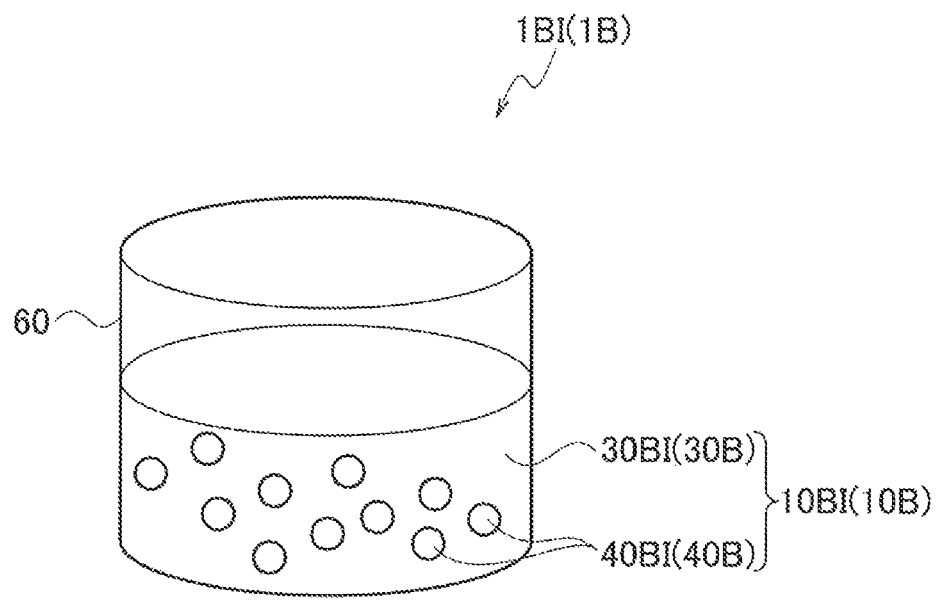
FIG. 18 is a schematic perspective view illustrating a pressure sensor according to a 12th embodiment.

FIG. 18 is a schematic perspective view illustrating a pressure sensor according to a 12th embodiment. A pressure sensor 1BI (1B) illustrated in FIG. 18 includes a pressure sensor body 10BI (10B). The pressure sensor body 10BI includes a base material 30BI (30B) and a functional element 40BI (40B) contained in the base material 30BI. The pressure sensor body 10BI is in the form of slurry or gel. The pressure sensor body 10BI, which is fluid, is accommodated in a container 60. The pressure sensor 1BI includes the pressure sensor body 10BI and the container 60 accommodating the pressure sensor body 10BI.

The pressure sensor 1BI according to the 12th embodiment (illustrated in FIG. 18) is the same as the pressure sensor 1BC according to the sixth embodiment (illustrated in FIGS. 12A and 12B) excepting the configuration of the pressure sensor body 10BI. The same members of the pressure sensor 1BI according to the 12th embodiment (illustrated in FIG. 18) as those of the pressure sensor 1BC according to the sixth embodiment (illustrated in FIGS. 12A and 12B) are given the same reference symbols, and the description of the configurations and operations thereof is omitted or simplified.
(Pressure Sensor Body)

The pressure sensor body 10BI includes the base material 30BI and the functional element 40BI contained in the base material 30BI.

The base material 30BI is liquid or gel. The material of the base material 30BI is not limited particularly, and examples thereof are publicly-known organic solvents and inorganic solvents. Examples of the inorganic solvents include water. It is preferred that the base material 30BI is made of an organic or inorganic solvent because when slurry including the base material 30BI and functional element 40BI is sprayed onto an object, the base material 30BI easily volatilizes with only the functional element 40BI easily fixed to the object. When the base material 30BI is made of gel and the gel including the base material 30BI and functional element 40BI is sprayed onto an object, the functional element 40BI in the gel easily adheres to or is fixed to the object.

As illustrated in FIG. 18, in the pressure sensor body 10BI, the particles 40BI made of the functional titanium oxide are dispersed in the base material 30BI. The temperature sensor body 10BI is obtained by adding the particles 40BI made of the functional titanium oxide to the base material 30BI, followed by mixing, for example.
(Operation of Pressure Sensor)

The operations of the pressure sensor 1BI depend on whether the pressure sensor body 10BI includes the base material 30BI in the process of measuring the pressure of an object. Herein, the case where the pressure sensor body 10BI includes the base material 30BI in the process of measuring the pressure of an object includes a case where the pressure sensor body 10BI is used by flowing within the object, such as a pipe, for example. The case where the pressure sensor body 10BI does not include the base material 30BI in the process of measuring the pressure of an object includes a case where the pressure sensor body 10BI is sprayed onto the object to vaporize the base material 30BI with only the functional element 40BI fixed for use.

The operations of the pressure sensor 1BI in the case where the pressure sensor body 10BI includes the base material 30BI in the process of measuring the pressure of an object are substantially the same as those of the pressure sensor 1BC according to the sixth embodiment (illustrated in FIGS. 12A and 12B). This is because the base material 30B is interposed between the pressure sensor 1BI and the object. The description of the operations in this case is omitted. The pressure sensor body 10BI is suitably used by flowing within the object, such as a pipe, for pressure measurement. This allows for pressure measurement in sections where it is difficult to measure pressure from the outside of the pipe. In this case, the pressure applied to the pressure sensor body 10BI by the object, such as a pipe, is pressure applied through the base material 30BI.

The operations of the pressure sensor 1BI in the case where the pressure sensor body 10BI does not include the base material 30BI in the process of measuring the pressure of the object are substantially the same as those of the pressure sensor 1BA according to the fourth embodiment illustrated in FIGS. 10A and 10B. This is because the base material 30B is not interposed between the pressure sensor 1BI and the object. The description of the operations in this case is omitted. The pressure sensor 1BI is suitably used in such a manner that the pressure sensor body 10BI is sprayed onto the object to vaporize the base material 30BI with only the functional element 40BI fixed. This allows for pressure measurement of just the section on which the pressure sensor body 10BI is sprayed.
(Effect of Pressure Sensor)

The pressure sensor 1BI exerts the same effects as those of the pressure sensor 1BA according to the fourth embodiment (illustrated in FIG. 10) or the pressure sensor 1BC according to the sixth embodiment (illustrated in FIGS. 12A and 12B).

13th Embodiment

Figure 19:
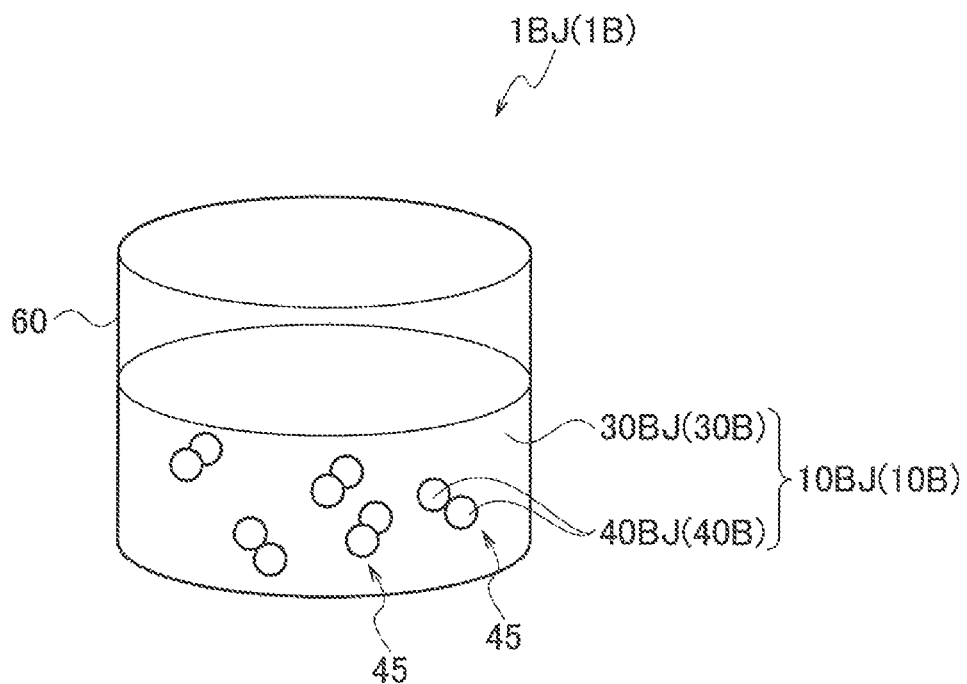
FIG. 19 is a schematic perspective view illustrating a pressure sensor according to a 13th embodiment.

FIG. 19 is a schematic perspective view illustrating a pressure sensor according to a 13th embodiment. A pressure sensor 1BJ (1B) illustrated in FIG. 19 includes a pressure sensor body 10BJ (10B). The pressure sensor body 10BJ includes a base material 30BJ (30B) and a functional element 40BJ (40B) contained in the base material 30BJ.

The pressure sensor 1BJ according to the 13th embodiment (illustrated in FIG. 19) is the same as the pressure sensor 1BI according to the 12th embodiment (illustrated in FIG. 18), excepting the configuration of the pressure sensor body 10BJ. The same members of the pressure sensor 1BJ according to the 13th embodiment (illustrated in FIG. 19) as those of the pressure sensor 1BI according to the 12th embodiment (illustrated in FIG. 18) are given the same reference symbols, and the description of the configurations and operations thereof is omitted or simplified.
(Pressure Sensor Body)

The pressure sensor body 10BJ includes the base material 30BJ and the functional element 40BJ contained in the base material 30BJ.

The base material 30BJ is the same as the base material 30BI used in the pressure sensor 1BI according to the 12th embodiment (illustrated in FIG. 18).

In the pressure sensor body 10BJ, the functional element 40BJ is particles 40BJ made of the functional titanium oxide, in a similar manner to the functional element 40BI used in the pressure sensor 1BI according to the 12th embodiment (illustrated in FIG. 18). The particles 40BJ made of the functional titanium oxide may be the same as the particles 40BI made of the functional titanium oxide used in the pressure sensor 1BI according to the 12th embodiment (illustrated in FIG. 18).

As illustrated in FIG. 19, in the pressure sensor body 10BJ, the particles 40BJ made of the functional titanium oxide are interconnected in groups to form the functional titanium oxide-particle connected bodies 45. In the pressure sensor body 10BJ, the particles 40BJ made of the functional titanium oxide are contained in the base material 30BJ so as to be interconnected in groups. The number of particles 40BJ interconnected in each functional titanium oxide-particle connected body 45 is any value not less than two. In the example of FIG. 19, the number of particles 40BJ interconnected in each functional titanium oxide-particle connected body 45 is two.

The pressure sensor body 10BJ is obtained by adding the functional titanium oxide-particle connected bodies 45 which are composed of the particles 40BJ made of the functional titanium oxide and interconnected in groups, to the base material 30BJ, followed by mixing, for example.
(Operation of Pressure Sensor)

The operations of the pressure sensor 1BJ are the same as those of the pressure sensor 1BI according to the 12th embodiment (illustrated in FIG. 18).
(Effect of Pressure Sensor)

The pressure sensor 1BJ exerts the same effects as those of the pressure sensor 1BI according to the 12th embodiment (illustrated in FIG. 18).

14th Embodiment

Figure 20:
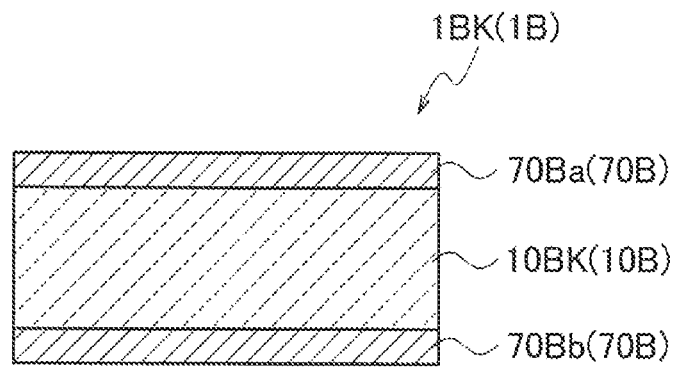
FIG. 20 is a schematic cross-sectional view illustrating a pressure sensor according to a 14th embodiment.

FIG. 20 is a schematic cross-sectional view illustrating a pressure sensor according to a 14th embodiment. A pressure sensor 1BK (1B) illustrated in FIG. 20 includes a pressure sensor body 10BK (10B) and electrodes 70Ba and 70Bb (70B), which are in contact with the pressure sensor body 10BK. Specifically, the pressure sensor 1BK includes the pressure sensor body 10BK and, additionally the two electrodes 70Ba and 70Bb, which are in contact with the pressure sensor body 10BK.

The pressure sensor body 10BK (10B) (illustrated in FIG. 20) has any shape. The shape of the pressure sensor body 10BK (10B) may be a columnar shape like the pressure sensor body 10BA (illustrated in FIG. 10) or a plate shape like the pressure sensor body 10BC (illustrated in FIG. 12A).

As illustrated in FIG. 20, the electrodes 70Ba and 70Bb are provided so as to sandwich the pressure sensor body 10BK. The electrodes 70Ba and 70Bb have any shape. The electrodes 70B which are in contact with the pressure sensor body 10BK can include three or more electrodes 70B, not illustrated.

The pressure sensor body 10BK constituting the pressure sensor 1BK is not limited particularly. Examples of the pressure sensor body 10BK include the pressure sensor bodies 10BA to 10BH, which constitute the pressure sensors 1BA to 1BH of the aforementioned fourth to 11th embodiments, respectively.

The material of the electrodes 70B constituting the pressure sensor 1BK is not limited particularly. Examples thereof are metals such as Al, Ag, and Au, conducting oxides such as ITO, conducting polymers, and carbon materials such as graphite.
(Operations of Pressure Sensor)

As described above, β-phase trititanium pentoxide and λ-phase trititanium pentoxide have different electric conductivities. For example, β-phase trititanium pentoxide has an electric conductivity in the same range as that of many semiconductors while λ-phase trititanium pentoxide has an electric conductivity in the same range as that of many metals. Such a difference in electric conductivity is maintained after the functional titanium oxide is cooled to room temperature.

The pressure sensor 1BK functions as a pressure sensor by using the electrodes 70Ba and 70Bb (70B), which are in contact with the pressure sensor body 10BK, to measure the electric conductivity of the functional element 40B constituting the pressure sensor body 10BK.
(Effect of Pressure Sensor)

According to the pressure sensor 1BK, the electrodes 70B are used to measure the electric conductivity of the functional element 40B constituting the pressure sensor body 10BK. The pressure sensor 1BK thereby exerts the same effects as those of the pressure sensor 1BA according to the fourth embodiment (illustrated in FIG. 10) or the pressure sensor 1BC according to the sixth embodiment (illustrated in FIG. 12A).

Figure 21:
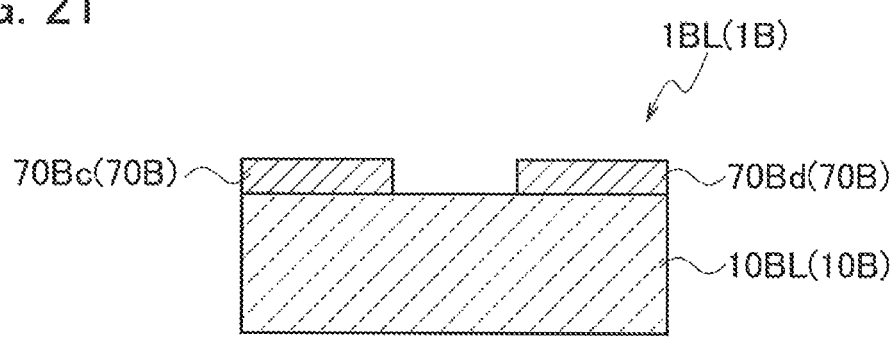
FIG. 21 is a schematic cross-sectional view illustrating a pressure sensor according to a 15th embodiment.

(15th Embodiment) FIG. 21 is a schematic cross-sectional view illustrating a pressure sensor according to a 15th embodiment. A pressure sensor 1BL (1B) (illustrated in FIG. 21) includes a pressure sensor body 10BL (10B) and electrodes 70Bc and 70Bd (70B), which are in contact with the pressure sensor body 10BL. Specifically, the pressure sensor 1BL includes the pressure sensor body 10BL and additionally the two electrodes 70Bc and 70Bd, which are in contact with the pressure sensor body 10BL.

The pressure sensor body 10BL (10B) (illustrated in FIG. 21) has any shape. The shape of the pressure sensor body 10BL (10B) may be a columnar shape like the pressure sensor body 10BA (illustrated in FIG. 10) or a plate shape like the pressure sensor body 10BC (illustrated in FIG. 12A).

As illustrated in FIG. 21, the electrodes 70Bc and 70Bd are provided so as to sandwich the pressure sensor body 10BL. The electrodes 70Bc and 70Bd have any shape. The electrodes 70B which are in contact with the pressure sensor body 10BL can include three or more electrodes 70B (not illustrated).

The pressure sensor body 10BL constituting the pressure sensor 1BL is the same as the pressure sensor body 10BK constituting the pressure sensor 1BK of the aforementioned 14th embodiment, for example.
(Operation of Pressure Sensor)

The operations of the pressure sensor 1BL are the same as those of the pressure sensor 1BK according to the 14th embodiment (illustrated in FIG. 20).

(Effect of Pressure Sensor)

The pressure sensor 1BL exerts the same effects as those of the pressure sensor 1BK according to the 14th embodiment (illustrated in FIG. 20).

16th Embodiment

Figure 22:
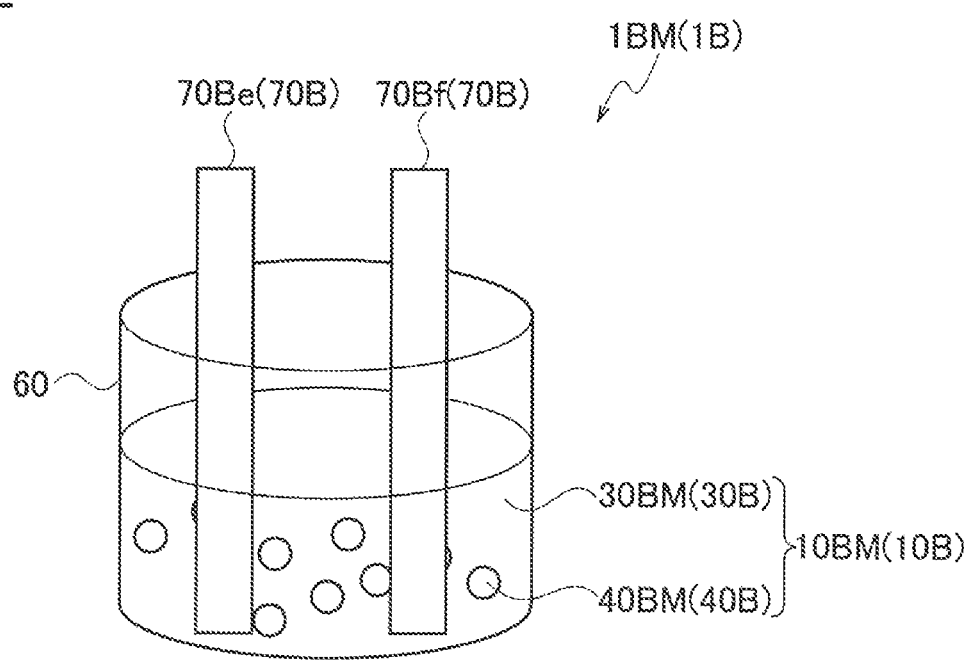
FIG. 22 is a schematic perspective view illustrating a pressure sensor according to a 16th embodiment.

FIG. 22 is a schematic perspective view illustrating a pressure sensor according to a 16th embodiment. A pressure sensor 1BM (1B) (illustrated in FIG. 22) includes a pressure sensor body 10BM (10B) and electrodes 70Be and 70Bf (70B) which are in contact with the pressure sensor body 10BM. Specifically, the pressure sensor 1BM includes the pressure sensor body 10BM and additionally the two electrodes 70Be and 70Bf, which are in contact with the pressure sensor body 10BM. As illustrated in FIG. 22, the electrodes 70Be and 70Bf are partially immersed in the pressure sensor body 10BM. The electrodes 70B which are in contact with the pressure sensor body 10BM can include three or more electrodes 70B, which are not illustrated.

The pressure sensor body 10BM includes a base material 30BM (30B) and a functional element 40BM (40B) contained in the base material 30BM. The pressure sensor body 10BM is in the form of slurry or gel. The pressure sensor body 10BM, which is fluid, is accommodated in the container 60. The pressure sensor 1BM includes the pressure sensor body 10BM and the container 60 accommodating the pressure sensor body 10BM.

The pressure sensor 1BM according to the 16th embodiment (illustrated in FIG. 22) includes the electrodes 70Be and 70Bf (70B) which are in contact with the pressure sensor body 10BM, in addition to the pressure sensor 1BI according to the 12th embodiment (illustrated in FIG. 18). The configuration of the pressure sensor 1BM is the same as that of the pressure sensor 1BI according to the 12th embodiment (illustrated in FIG. 18), excepting the configuration of the electrodes 70Be and 70Bf (70B). The description of the configurations other than the electrodes 70Be and 70Bf (70B) is omitted.

The material and operations of the electrodes 70Be and 70Bf (70B) are the same as those of the electrodes 70Ba and 70Bb (70B) of the pressure sensor 1BK according to the 14th embodiment (illustrated in FIG. 20) although the shape thereof is different. The description of the electrodes 70Be and 70Bf is omitted.

(Operation of Pressure Sensor)

The operations of the pressure sensor 1BM integrate the operations of the pressure sensor 1BI according to the 12th embodiment (illustrated in FIG. 18) and the operations of the pressure sensor 1BK according to the 14th embodiment (illustrated in FIG. 20). The description of the operations is omitted.

(Effect of Pressure Sensor)

The pressure sensor 1BM exerts the same effects as those of the pressure sensor 1BI according to the 12th embodiment (illustrated in FIG. 18) and the pressure sensor 1BK according to the 14th embodiment (illustrated in FIG. 20).

Modification of 16th Embodiment

In a pressure sensor body 10BM of the pressure sensor 1BM according to the 16th embodiment (illustrated in FIG. 22), particles 40BM made of the functional titanium oxide are dispersed in a base material 30BM in a similar manner to the pressure sensor body 10BI of the pressure sensor 1BI (illustrated in FIG. 18).

As a modification of the 16th embodiment, the pressure sensor body 10BJ of the pressure sensor 1BJ according to the 13th embodiment (illustrated in FIG. 19) may be used instead of the pressure sensor body 10BM. In the pressure sensor body 10B as the modification of the 16th embodiment, the particles 40B made of the functional titanium oxide may be contained in the base material 30B so as to be interconnected in groups.

The operations of the pressure sensor according to the modification integrate the operations of the pressure sensor 1BJ according to the 13th embodiment, (illustrated in FIG. 19) and the operations of the pressure sensor 1BK according to the 14th embodiment, (illustrated in FIG. 20). The description of the operations is omitted.

(Effect of Pressure Sensor)

The pressure sensor 1BM exerts the same effects as those of the pressure sensor 1BJ according to the 13th embodiment (illustrated in FIG. 19) and the pressure sensor 1BK according to the 14th embodiment (illustrated in FIG. 20).

EXAMPLES

Hereinafter, the embodiments are further described in more detail through Examples but are not limited to Examples.

Example 1

The pressure sensor 1BA composed of the functional element 40BA (illustrated in FIG. 10) was prepared. The functional element 40BA includes the characteristic corresponding to the functional element 40AA illustrated in FIG. 2. Furthermore, the pressure sensor 1BA composed of the functional element 40BA (40AA) was prepared using the pressure sensor 1BA composed of the functional element 40BA (40AA), which is described in more detail.

(Preparation of Functional Titanium Oxide)

Figure 9:
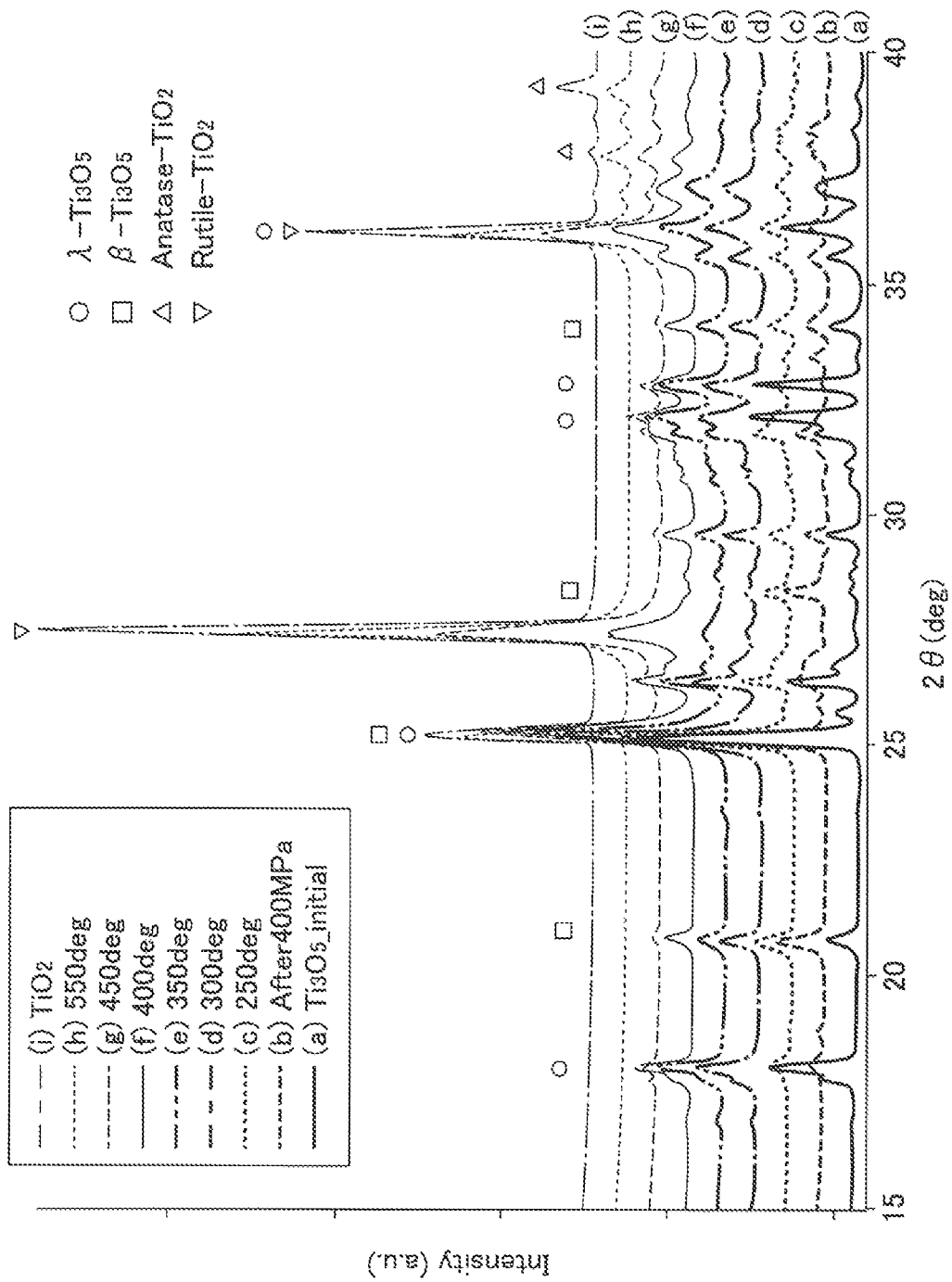
FIG. 9 is a diagram illustrating X-ray diffraction analysis results.

First, $TiO_2$ including rutile and anatase was prepared as the raw material. The result of X-ray diffraction for the prepared $TiO_2$ is illustrated in (i) of FIG. 9. Next, the $TiO_2$ was baked at 1140° C. for two hours in hydrogen gas atmosphere to form $Ti_3O_5$ powder. The result of X-ray diffraction for the obtained $Ti_3O_5$ powder is illustrated in (a) of FIG. 9. The result of X-ray diffraction in (a) of FIG. 9 has revealed that each powder sample of the obtained $Ti_3O_5$ powder included a mixture of λ-phase $Ti_3O_5$ and β-phase $Ti_3O_5$.

As shown in the later-described heating test result, the obtained $Ti_3O_5$ powder was heated to change into $TiO_2$, which was then maintained as $TiO_2$ after cooling. As shown in the later-described pressurization test result, when the obtained $Ti_3O_5$ powder was pressurized, the composition ratio of λ-phase $Ti_3O_5$ decreased while the composition ratio of β-phase $Ti_3O_5$ increased. The higher the pressure applied to $Ti_3O_5$ powder, the lower the composition ratio of λ-phase $Ti_3O_5$ and the higher the composition ratio of β-phase $Ti_3O_5$. The $Ti_3O_5$ powder was therefore found to be the functional titanium oxide.

(Preparation of Functional Titanium Oxide Molded Body)

Next, using a hydraulic press and a die, the obtained $Ti_3O_5$ powder was exposed to a pressure of 20 to 400 MPa, preparing columnar molded bodies illustrated in FIG. 10. The prepared molded bodies were pellets of $Ti_3O_5$ powder. The result of X-ray diffraction for the molded bodies is illustrated in (b) of FIG. 9. The (b) of FIG. 9 has revealed that the molded bodies were composed of a mixture of λ-phase $Ti_3O_5$ and β-phase $Ti_3O_5$ in a similar manner to the $Ti_3O_5$ powder illustrated in (a) of FIG. 9.

(Heating Test of Functional Titanium Oxide Molded Body)

The obtained molded bodies were subjected to heating tests at different heating temperatures in air. Specifically, plural molded bodies made of $Ti_3O_5$ were prepared as samples, which were subjected to heating tests to be heated to 250, 300, 350, 400, 450, and 550° C. The samples after the heating tests were subjected to X-ray diffraction. The results of X-ray diffraction for the samples heated to 250, 300, 350, 400, 450, and 550° C. are illustrated in (c), (d), (e), (f), (g), and (h) of FIG. 9, respectively. These results of X-ray diffraction have revealed that the β-phase $Ti_3O_5$ decreased with the heating temperature while the λ-phase $Ti_3O_5$ increased. It has been also revealed that when the heating temperature exceeded 350° C., the diffraction peaks of $TiO_2$ appeared. When the heating temperature reached 550° C., only diffraction peaks of $TiO_2$ were observed similarly to (i) of FIG. 9.

As described above, it was revealed that the obtained molded bodies and the $Ti_3O_5$ powder constituting the molded bodies included crystal grains of one or more of β-phase $Ti_3O_5$ and λ-phase $Ti_3O_5$ before heating. Further, it was revealed that the molded bodies and the $Ti_3O_5$ powder had the property that at least a portion of crystal grains of one or more of β-$Ti_3O_5$ and λ-$Ti_3O_5$ changed into crystal grains of $TiO_2$ when heated to 350° C. or higher. Furthermore, it was revealed that the crystalline structure having changed by heating was maintained after cooling. The materials of the molded bodies and the $Ti_3O_5$ powder constituting the molded bodies were therefore found to be the functional titanium oxide. In addition, it was revealed that the molded bodies corresponded to the functional elements 40AA and 40BA made of the functional titanium oxide.

(Pressurization Test of Functional Titanium Oxide)

The aforementioned functional titanium oxide powder was subjected to pressurization tests.

First, the functional titanium oxide powder was heated at 300° C. for 120 minutes so as to increase the phase ratio of λ-phase trititanium pentoxide (λ-$Ti_3O_5$) while reducing the phase ratio of β-phase trititanium pentoxide (β-$Ti_3O_5$). In each functional titanium oxide sample, the phase ratio of λ-phase trititanium pentoxide was 86 mol %; the phase ratio of β-phase trititanium pentoxide was 14 mol %; and the average grain size (median diameter) of crystal grains was 110 nm. The phase ratios of the λ- and β-phase trititanium pentoxide were calculated by the X-ray diffraction pattern measured with an X-ray diffractometer (by Rigaku Corporation).

Next, using a hydraulic press (by RIKENKIKI CO., LTD) and a die, pressurization tests were performed by filling the die with the functional titanium oxide powder into a columnar shape and then pressurizing the functional titanium oxide powder in the vertical direction to the direction of the upper and lower surfaces thereof. The pressurization tests were performed individually once for the respective functional titanium oxide samples with the applied pressure varied.

Figure 23:
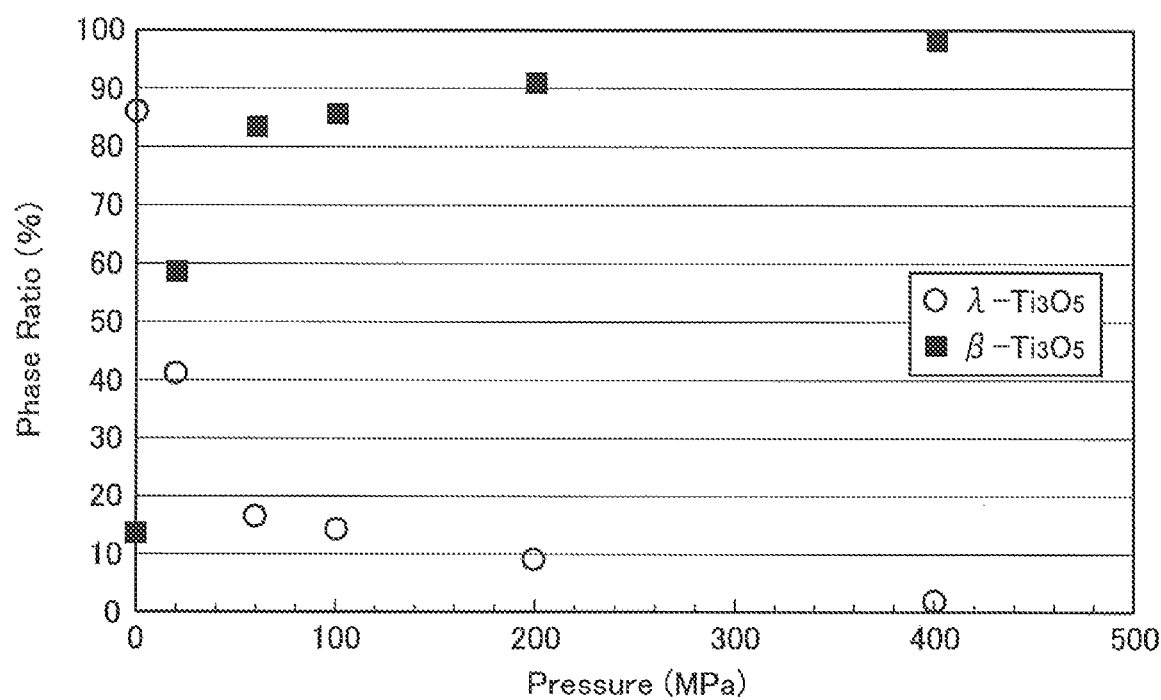
FIG. 23 is a graph illustrating a relationship between pressure applied to functional titanium oxide and the phase ratio of λ-$Ti_3O_5$ (λ-phase content) and phase ratio of β-$Ti_3O_5$ (β-phase content) in the functional titanium oxide after pressurization.

The phase ratios of λ-phase trititanium pentoxide and β-phase trititanium pentoxide were measured in the functional titanium oxide samples after pressurization. The results thereof are illustrated in FIG. 23. FIG. 23 is a graph illustrating the relationship between pressure applied to the functional titanium oxide and the phase ratio (λ-phase content) of λ-$Ti_3O_5$ and the phase ratio (β-phase content) of β-$Ti_3O_5$ in the functional titanium oxide after pressurization. The unit of the λ-phase content and β-phase content is mol %.

FIG. 23 has revealed that, with an increase in the pressure applied to the functional titanium oxide, the phase ratio of λ-phase trititanium pentoxide exhibits a monotonically decreasing curve while the phase ratio of β-phase trititanium pentoxide exhibits a monotonically increasing curve. In addition, the phase ratio of λ-phase trititanium pentoxide and the phase ratio of β-phase trititanium pentoxide were estimated to be reversed in a range from 0 to 20 MPa.

The results of the pressurization tests have revealed that the molded bodies of the functional titanium oxide powder correspond to the functional elements 40AA and 40BA.

(Preparation of Pressure Sensor)

Central part of the surface of a plate-shaped Si substrate was etched by reactive ion etching. In the central part of the surface of the plate-shaped Si substrate, the substrate thin-film section 51 with a thickness of 10 am was formed. Next, the aforementioned functional element 40AA was laid on the plate-shaped Si substrate with a thickness of 1.0 mm so as to be in physical contact with the same. The plate-shaped Si substrate and functional element 40AA were thereby integrated. The pressure sensor 1AA illustrated in FIG. 6 was thereby produced. The substrate thin-film section 51 was as thin as 10 am, and the pressure sensor 1AA was found to be able to detect slight pressures such as ultrasonic pressures.

Example 2

(Preparation of Functional Titanium Oxide)

In a similar manner to Example 1, $TiO_2$ was baked at four different temperatures in a range from 1100 to 1300° C. for two hours in a hydrogen gas atmosphere so as to vary the phase ratio ($PR_λ$ mol %) of λ-phase trititanium pentoxide and the phase ratio ($PR_β$ mol %) of β-phase trititanium pentoxide, preparing functional titanium oxide powder (samples A, B, C, and D). The sum of $PR_λ$ mol % and $PR_β$ mol % of each sample was 100 mol %.

(Pressurization Test of Functional Titanium Oxide)

The aforementioned functional titanium oxide powder (samples A, B, C, and D) were subjected to pressurization tests.

First, for the powder samples A, B, C, and D, the phase ratio ($PR_λ$ mol %) of λ-phase trititanium pentoxide was divided by the phase ratio ($PR_β$ mol %) of β-phase trititanium pentoxide to calculate a value of the λ-phase/β-phase ratio (λ-phase content/β-phase content). The λ-phase/β-phase ratios of the samples A, B, C, and D were 5.7, 6.2, 15, and 21, respectively. When the λ-phase/β-phase ratio was 4, $PR_λ$ % and $PR_β$ mol % were 80 and 20 mol %, respectively. When the λ-phase/β-phase ratio was 9, $PR_λ$ % and $PR_β$ mol % were 90 and 10 mol %, respectively.

Figure 24:
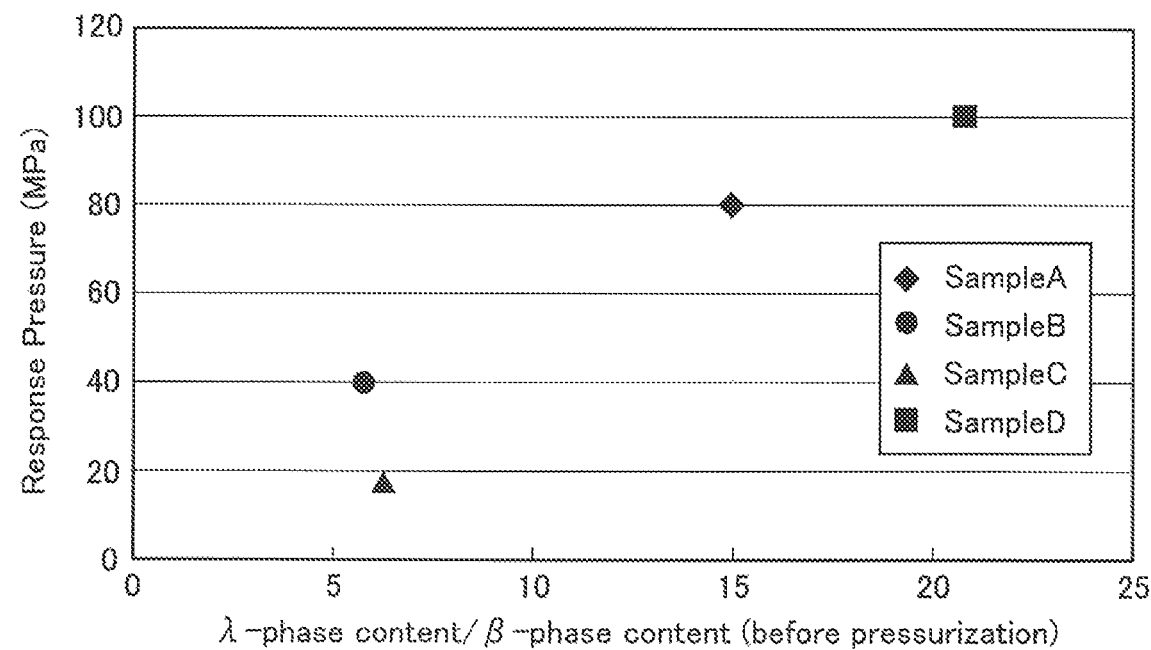
FIG. 24 is a graph illustrating a relationship between the λ-phase/β-phase ratio (λ-phase content/β-phase content) of the functional titanium oxide before the pressurization and applied pressure (response pressure) necessary to reduce the λ-phase content of the functional titanium oxide by 30%.

Next, the powder samples A, B, C, and D were pressurized in the same manner as the pressurization tests of Example 1 to measure applied pressure (response pressure) necessary for the phase ratio ($PR_λ$ mol %) of λ-phase trititanium pentoxide to decrease by 30 mol %. In the case of the sample having a $PR_λ$ of 70 mol % and a $PR_β$ of 30 mol %, the test was performed to measure necessary pressure applied to the sample for the $PR_λ$ % and $PR_β$ mol % to reach 40 and 60 mol %, respectively. The results thereof are illustrated in FIG. 24. FIG. 24 is a graph illustrating the relationship between the λ-phase/β-phase ratio (λ-phase content/β-phase content) of the functional titanium oxide before pressurization and necessary pressure (response pressure) applied to the functional titanium oxide for the λ-phase content of the functional titanium oxide to decrease by 30%.

FIG. 24 shows that samples having a higher λ-phase/β-phase ratio (λ-phase content/β-phase content) before pressurization has a tendency of having a larger response pressure. It is therefore revealed that the functional titanium oxide having a higher λ-phase ratio before pressurization requires larger applied pressure to change in physical property.

The entire contents of Japanese Patent Application Publications No. 2016-208521 (filed on: Oct. 25, 2016) and No. 2017-078902 (filed on: Apr. 12, 2017) are incorporated by reference herein.

The embodiments are described through Examples. However, it should be obvious to those skilled in the art that the embodiments are not limited to these descriptions and various modifications and improvements can be made for the embodiments.

INDUSTRIAL APPLICABILITY

According to the first pressure sensor, it is possible to provide an inexpensive pressure sensor which includes the inexpensive functional element that changes in physical property with a change in temperature or pressure and in which separation of the substrate from the functional element or electrodes and cracks in the functional element and electrodes are prevented or reduced.

According to the second pressure sensor, it is possible to provide a pressure sensor which can be used repeatedly and do not need a power supply.

The pressure sensors according to the embodiments can be used as pressure sensors capable of detecting pressures including ultrasonic pressures. In addition, the pressure sensors according to the embodiments can be used as temperature sensors. The temperature sensors can be used in electric furnaces, switchboards, tubes, and the like, which require temperature measurement in a high-temperature range not lower than 350° C., for example.

REFERENCE SIGNS LIST 1A, 1AA, 1AB, 1AC, 1B, 1BA, 1BB, 1BC, 1BD, 1BE, 1BF, 1BG, 1BH, 1BI, 1BJ, 1BK, 1BL, 1BM PRESSURE SENSOR
10B, 10BA, 10BB, 10BC, 10BD, 10BE, 10BF, 10BG, 10BH, 10BI, 10BJ, 10BK, 10BL, 10BM PRESSURE SENSOR BODY
30B, 30BC, 30BD, 30BE, 30BF, 30BG, 30BH, 30BI, 30BJ BASE MATERIAL
40A, 40B, 40BA, 40BB, 40BC, 40BD, 40BE, 40BF, 40BG, 40BH, 40BI, 40BJ FUNCTIONAL ELEMENT
45 FUNCTIONAL TITANIUM OXIDE-PARTICLE CONNECTED BODY
50A, 50B, 150A SUBSTRATE
51 SUBSTRATE THIN-FILM SECTION
52 SUBSTRATE WALL SECTION
53 SUBSTRATE PERIPHERAL SECTION
60 CONTAINER
70A, 70B, 70Ba, 70Bb, 70Bc, 70Bd, 70Be, 70Bf ELECTRODE
100AA, 100AB, 100AC TEMPERATURE SENSOR

The invention claimed is:

1. A pressure sensor, comprising:
a substrate;
a functional element which is laid on the substrate and is composed of functional titanium oxide including crystal grains of at least one of β-phase trititanium pentoxide ($\beta$-$Ti_3O_5$) and λ-phase trititanium pentoxide ($\lambda$-$Ti_3O_5$) and having the property that at least a portion of crystal grains of at least one of β-phase trititanium pentoxide ($\beta$-$Ti_3O_5$) and λ-phase trititanium pentoxide ($\lambda$-$Ti_3O_5$) change into crystal grains of titanium dioxide ($TiO_2$) when the functional titanium oxide is heated to 350° C. or higher; and
two electrodes, wherein:
the substrate includes a substrate thin-film section having a thin film form in which the thickness in the stacking direction of the substrate and the functional element is smaller than that in the other directions,
the two electrodes are provided on the surface of the functional element, and
the pressure sensor receives ultrasonic waves through the substrate thin-film section and measures electric resistance between the two electrodes across the functional element.

2. A pressure sensor, comprising:
a substrate;
a functional element which is laid on the substrate and is composed of functional titanium oxide including crystal grains of at least one of β-phase trititanium pentoxide ($\beta$-$Ti_3O_5$) and λ-phase trititanium pentoxide ($\lambda$-$Ti_3O_5$) and having the property that at least a portion of crystal grains of at least one of β-phase trititanium pentoxide ($\beta$-$Ti_3O_5$) and λ-phase trititanium pentoxide ($\lambda$-$Ti_3O_5$) change into crystal grains of titanium dioxide ($TiO_2$) when the functional titanium oxide is heated to 350° C. or higher; and
one or more electrodes disposed on a surface of the functional element and one or more electrodes disposed in an interface between the substrate and functional element,
wherein:
the substrate includes a substrate thin-film section having a thin film form in which the thickness in the stacking direction of the substrate and the functional element is smaller than that in the other directions, and
an average grain size of the crystal grains of the functional titanium oxide is 5 to 50 nm.

3. The pressure sensor according to claim 1, wherein the substrate is made of one or more materials selected from a group consisting of semiconductors, SOI, oxides, metals, and polyimide resins.

4. The pressure sensor according to claim 1, wherein the two electrodes are made of one or more materials selected from a group consisting of metals, conducting oxides, carbons, and conducting polymers.

5. A pressure sensor, comprising:
a pressure sensor body including a functional element that has a composition of trititanium pentoxide ($Ti_3O_5$) and changes in physical property with a change in pressure when pressurized at 1 MPa or higher, wherein
the functional element is composed of functional titanium oxide which includes crystal grains of at least λ-phase trititanium pentoxide ($\lambda$-$Ti_3O_5$) when not pressurized and has the property that at least a portion of the crystal grains of λ-phase trititanium pentoxide ($\lambda$-$Ti_3O_5$) change into crystal grains of β-phase trititanium pentoxide ($\beta$-$Ti_3O_5$) when the functional titanium oxide is pressurized at 1 MPa or higher,
the functional titanium oxide includes crystal grains of β-phase trititanium pentoxide ($\beta$-$Ti_3O_5$) and λ-phase trititanium pentoxide ($\lambda$-$Ti_3O_5$) at lower than 350° C. and includes the property that at least a portion of the crystal grains of β-phase trititanium pentoxide (β-$Ti_3O_5$) and λ-phase trititanium pentoxide (λ-$Ti_3O_5$) change into crystal grains of titanium dioxide ($TiO_2$) when the functional titanium oxide is heated to 350° C. or higher, the pressure sensor body further includes a base material and the functional element is contained in the base material, the base material is made of resin, the functional element is particles made of the functional titanium oxide, and the particles made of the functional titanium oxide are dispersed or interconnected in groups in the base material.

6. A pressure sensor, comprising
a pressure sensor body including a functional element that has a composition of trititanium pentoxide ($Ti_3O_5$) and changes in physical property with a change in pressure when pressurized at 1 MPa or higher, wherein
the functional element is composed of functional titanium oxide which includes crystal grains of at least λ-phase trititanium pentoxide (λ-$Ti_3O_5$) when not pressurized and has the property that at least a portion of the crystal grains of λ-phase trititanium pentoxide (λ-$Ti_3O_5$) change into crystal grains of β-phase trititanium pentoxide (β-$Ti_3O_5$) when the functional titanium oxide is pressurized at 1 MPa or higher,
the functional titanium oxide includes crystal grains of β-phase trititanium pentoxide (β-$Ti_3O_5$) and λ-phase trititanium pentoxide (λ-$Ti_3O_5$) at lower than 350° C. and includes the property that at least a portion of the crystal grains of β-phase trititanium pentoxide (β-$Ti_3O_5$) and λ-phase trititanium pentoxide (λ-$Ti_3O_5$) change into crystal grains of titanium dioxide ($TiO_2$) when the functional titanium oxide is heated to 350° C. or higher,
the pressure sensor body further includes a base material and the functional element is contained in the base material,
the base material is a film,
the functional element is particles made of the functional titanium oxide, and
the particles made of the functional titanium oxide are dispersed or interconnected in groups in the base material.

7. A pressure sensor, comprising
a pressure sensor body including a functional element that has a composition of trititanium pentoxide ($Ti_3O_5$) and changes in physical property with a change in pressure when pressurized at 1 MPa or higher, wherein
the functional element is composed of functional titanium oxide which includes crystal grains of at least λ-phase trititanium pentoxide (λ-$Ti_3O_5$) when not pressurized and has the property that at least a portion of the crystal grains of λ-phase trititanium pentoxide (λ-$Ti_3O_5$) change into crystal grains of β-phase trititanium pentoxide (β-$Ti_3O_5$) when the functional titanium oxide is pressurized at 1 MPa or higher,
the functional titanium oxide includes crystal grains of β-phase trititanium pentoxide (β-$Ti_3O_5$) and λ-phase trititanium pentoxide (λ-$Ti_3O_5$) at lower than 350° C. and includes the property that at least a portion of the crystal grains of β-phase trititanium pentoxide (β-$Ti_3O_5$) and λ-phase trititanium pentoxide (λ-$Ti_3O_5$) change into crystal grains of titanium dioxide ($TiO_2$) when the functional titanium oxide is heated to 350° C. or higher, the pressure sensor body further includes a base material and the functional element is contained in the base material,
the base material is a sheet composed of woven or non-woven fabric,
the functional element is particles made of the functional titanium oxide, and
the particles made of the functional titanium oxide are dispersed or interconnected in groups in the base material.

8. A pressure sensor, comprising
a pressure sensor body including a functional element that has a composition of trititanium pentoxide ($Ti_3O_5$) and changes in physical property with a change in pressure when pressurized at 1 MPa or higher, wherein
the functional element is composed of functional titanium oxide which includes crystal grains of at least λ-phase trititanium pentoxide (λ-$Ti_3O_5$) when not pressurized and has the property that at least a portion of the crystal grains of λ-phase trititanium pentoxide (λ-$Ti_3O_5$) change into crystal grains of β-phase trititanium pentoxide (β-$Ti_3O_5$) when the functional titanium oxide is pressurized at 1 MPa or higher,
the functional titanium oxide includes crystal grains of β-phase trititanium pentoxide (β-$Ti_3O_5$) and λ-phase trititanium pentoxide (λ-$Ti_3O_5$) at lower than 350° C. and includes the property that at least a portion of the crystal grains of β-phase trititanium pentoxide (β-$Ti_3O_5$) and λ-phase trititanium pentoxide (λ-$Ti_3O_5$) change into crystal grains of titanium dioxide ($TiO_2$) when the functional titanium oxide is heated to 350° C. or higher,
the pressure sensor body further includes a base material and the functional element is contained in the base material,
the base material is liquid or gel,
the functional element is particles made of the functional titanium oxide, and
the particles made of the functional titanium oxide are dispersed or interconnected in groups in the base material.

9. A pressure sensor, comprising:
a substrate; and
a functional element which is laid on the substrate and is composed of functional titanium oxide including crystal grains of at least one of β-phase trititanium pentoxide (β-$Ti_3O_5$) and λ-phase trititanium pentoxide (λ-$Ti_3O_5$) and having the property that at least a portion of crystal grains of at least one of β-phase trititanium pentoxide (β-$Ti_3O_5$) and λ-phase trititanium pentoxide (λ-$Ti_3O_5$) change into crystal grains of titanium dioxide ($TiO_2$) when the functional titanium oxide is heated to 350° C. or higher, wherein
the substrate includes a substrate thin-film section having a thin film form in which the thickness in the stacking direction of the substrate and the functional element is smaller than that in the other directions, and
an average grain size of the crystal grains of the functional titanium oxide is 5 to 50 nm.

10. The pressure sensor according to claim 9, further comprising two or more electrodes provided on a surface of the functional element.

11. The pressure sensor according to claim 9, further comprising one or more electrodes disposed on a surface of the functional element and one or more electrodes disposed in an interface between the substrate and functional element.

12. The pressure sensor according to claim 9, wherein the substrate is made of one or more materials selected from a group consisting of semiconductors, SOI, oxides, metals, and polyimide resins.

13. The pressure sensor according to claim 10, wherein the at least one electrode is made of one or more materials selected from a group consisting of metals, conducting oxides, carbons, and conducting polymers.

14. A pressure sensor, comprising
a pressure sensor body including a functional element that has a composition of trititanium pentoxide ($Ti_3O_5$) and changes in physical property with a change in pressure when pressurized at 1 MPa or higher,
wherein the functional element is composed of functional titanium oxide which includes crystal grains of at least λ-phase trititanium pentoxide (λ-$Ti_3O_5$) when not pressurized and has the property that at least a portion of the crystal grains of λ-phase trititanium pentoxide (λ-$Ti_3O_5$) change into crystal grains of β-phase trititanium pentoxide (β-$Ti_3O_5$) when the functional titanium oxide is pressurized at 1 MPa or higher,
the functional titanium oxide includes crystal grains of β-phase trititanium pentoxide (β-$Ti_3O_5$) and λ-phase trititanium pentoxide (λ-$Ti_3O_5$) at lower than 350° C. and includes the property that at least a portion of the crystal grains of β-phase trititanium pentoxide (β-$Ti_3O_5$) and λ-phase trititanium pentoxide (λ-$Ti_3O_5$) change into crystal grains of titanium dioxide ($TiO_2$) when the functional titanium oxide is heated to 350° C. or higher, and
an average grain size of the crystal grains of the functional titanium oxide is 5 to 50 nm.

15. The pressure sensor according to claim 14, wherein
the pressure sensor body is composed of the functional element, and
the functional element is a compact made of the functional titanium oxide.

16. The pressure sensor according to claim 14, wherein
the pressure sensor body is composed of the functional element,
the functional element is a thin film made of the functional titanium oxide, and
the thin film is formed on a substrate.

* * * * *